United States Patent
Wang et al.

(10) Patent No.: US 6,787,377 B2
(45) Date of Patent: Sep. 7, 2004

(54) DETERMINING METHOD OF THERMAL PROCESSING CONDITION

(75) Inventors: Wenling Wang, Tokyo-To (JP); Koichi Sakamoto, Tokyo-To (JP); Fujio Suzuki, Tokyo-To (JP); Moyuru Yasuhara, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 49 days.

(21) Appl. No.: 10/333,585

(22) PCT Filed: Jul. 23, 2001

(86) PCT No.: PCT/JP01/06352

§ 371 (c)(1),
(2), (4) Date: Jan. 24, 2003

(87) PCT Pub. No.: WO02/09164

PCT Pub. Date: Jan. 31, 2002

(65) Prior Publication Data

US 2003/0109071 A1 Jun. 12, 2003

(30) Foreign Application Priority Data

Jul. 25, 2000 (JP) ........................................ 2000-224146
Jul. 25, 2000 (JP) ........................................ 2000-224147

(51) Int. Cl.$^7$ .......................... G01R 31/26; H01L 21/66; G01K 3/00
(52) U.S. Cl. .......................... 438/14; 438/907; 438/909; 438/935; 374/102; 374/137
(58) Field of Search .................. 438/14, 907, 909, 438/935; 374/102, 137

(56) References Cited

U.S. PATENT DOCUMENTS 4,309,240 A * 1/1982 Zaferes ...................... 438/488
4,989,970 A * 2/1991 Campbell et al. ............ 356/73

FOREIGN PATENT DOCUMENTS

| JP | 5-291143 | 11/1993 |
| JP | 6-318551 | 11/1994 |
| JP | 11-186255 | 7/1999 |
| JP | 2000-77347 | 3/2000 |
| JP | 2000-195809 | 7/2000 |

OTHER PUBLICATIONS

International Preliminary Examination Report (PCT/IPEA/409) (translated) issued for PCT/JP01/06352.
Notification of Transmittal of Copies of Translation of the International Preliminary Examination Report (PCT/IB/338) issued for PCT/JP01/06352.

* cited by examiner

Primary Examiner—Craig A. Thompson
Assistant Examiner—Nema Berezny
(74) Attorney, Agent, or Firm—Smith, Gambrell & Russell, LLP

(57) ABSTRACT

The invention is a method of determining a set temperature profile for a method of controlling respective substrate temperatures of a plurality of groups in accordance with respective corresponding set temperature profiles, in a method of heat processing a plurality of substrates that are classified into the plurality of groups. The invention includes a first heat processing step of controlling respective substrate temperatures of a plurality of groups in accordance with respective predetermined provisional set temperature profiles for first-batch substrates that are classified into the plurality of groups, and of introducing a process gas to conduct a heat process to form films on the substrates; a first film-thickness measuring step of measuring a thickness of the films formed on the substrates; and a first set-temperature-profile amending step of respectively amending the provisional set temperature profiles based on the measured thickness, in such a manner that a thickness of films formed during a heat process is substantially the same between the plurality of groups. In the first heat processing step, the provisional set temperature profiles are profiles whose set temperatures change as time passes.

31 Claims, 25 Drawing Sheets

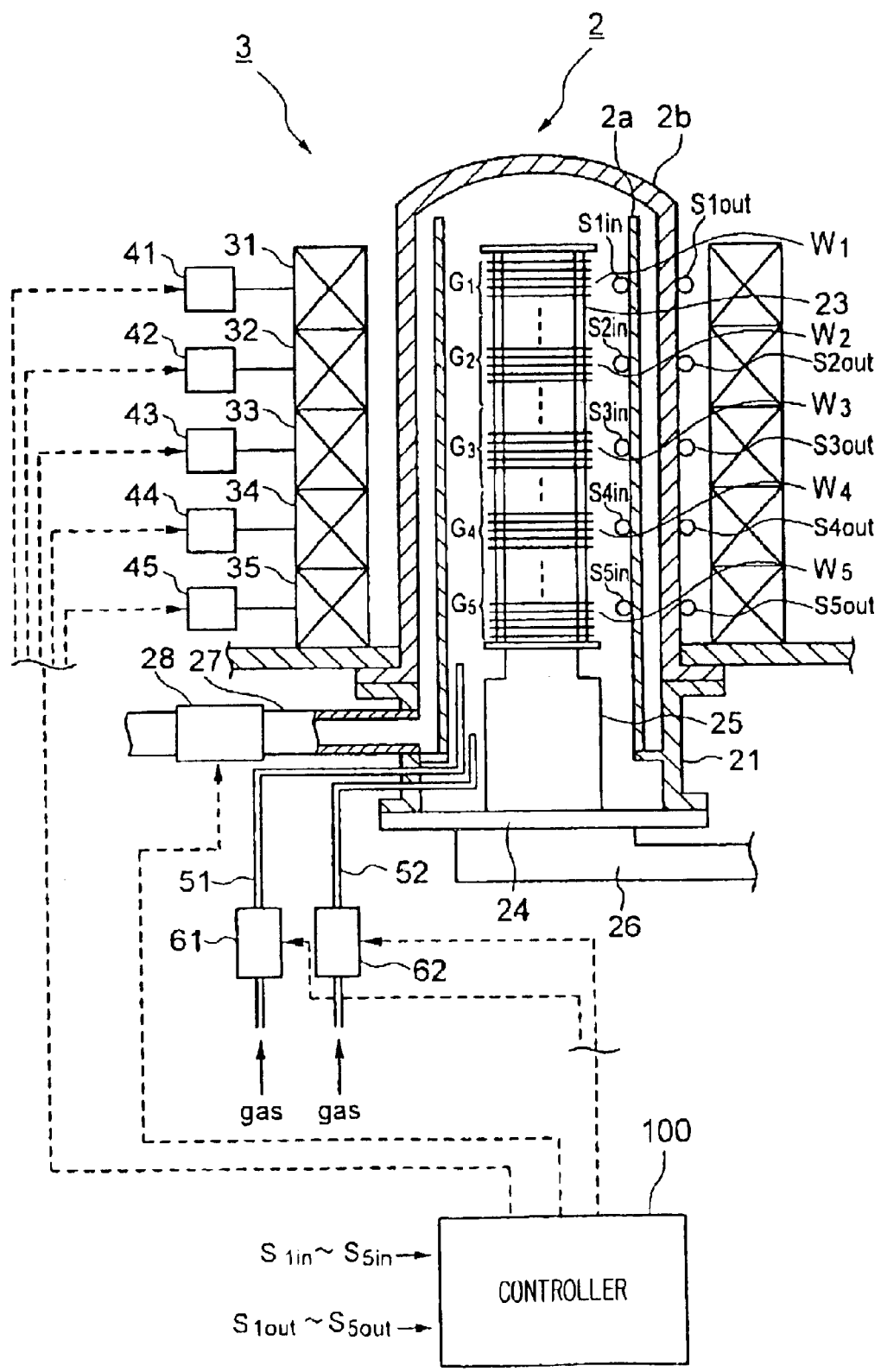
F I G. 1

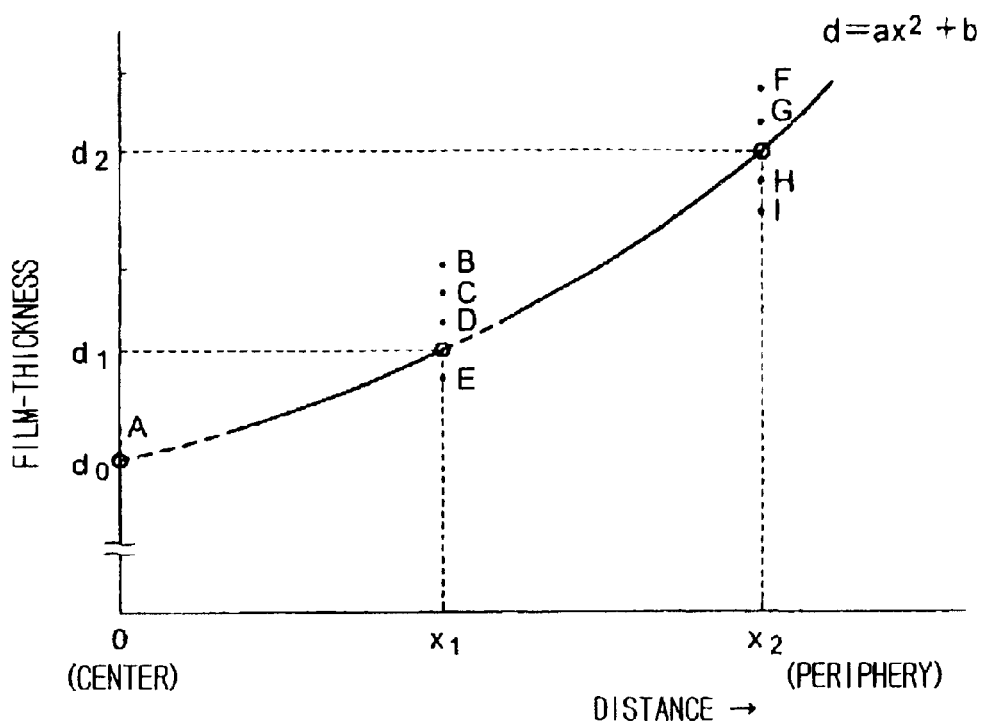
F I G. 12(A)
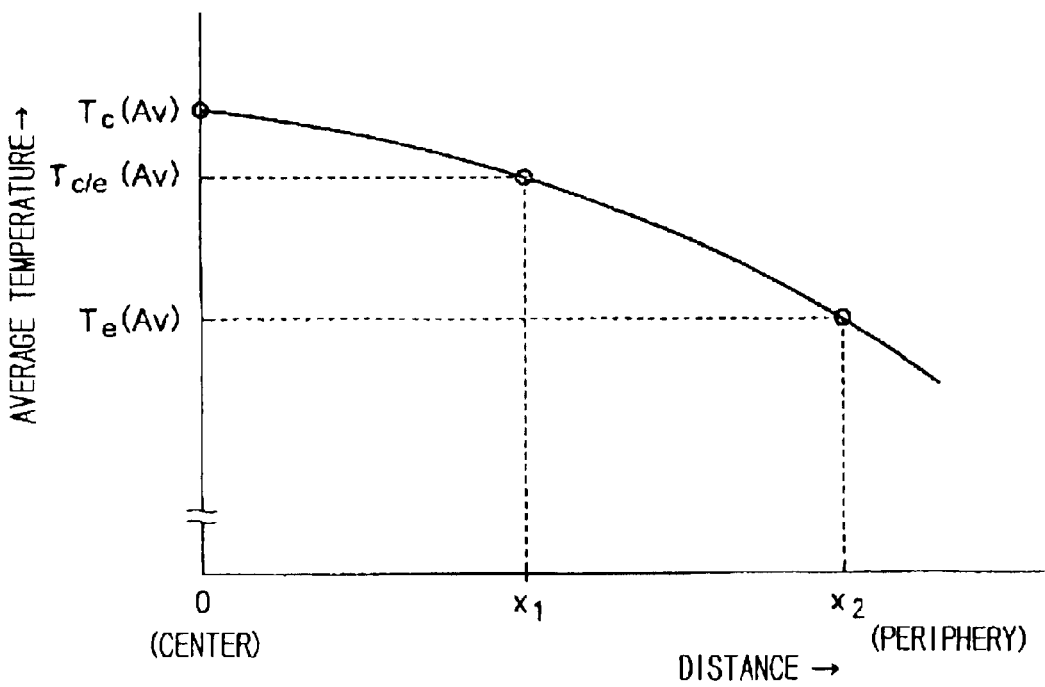
F I G. 12(B)

DETERMINING METHOD OF THERMAL PROCESSING CONDITION

TECHNICAL FIELD

The present invention relates to a determining method of a control condition for a thermal (heat) processing system that carries out a thermal process for an object to be processed such as a substrate. In particular, the present invention relates to a determining method of a control condition of a thermal processing system for forming a uniform film on a substrate.

BACKGROUND ART

For a semiconductor-device manufacturing process, as one of units that carry out a heat process to a semiconductor wafer (hereafter, a wafer) as a substrate, there is a vertical type of thermal processing unit that carries out a batch process. The unit holds many wafers in a tier-like manner with a wafer holder, which is called a wafer boat or the like, and transfers the holder into a vertical heat-processing furnace to conduct a CVD (Chemical Vapor Deposition) process or an oxidation process.

When a wafer undergoes a heat process by means of the thermal processing unit, ununiformity may arise in a condition of the heat process within a surface of the same wafer or between a plurality of wafers. As a result, unevenness in thickness distribution of a film formed by the heat process may be generated within a surface of the same processed wafer or between a plurality of processed wafers.

It is ideal that there is a uniform state in the thermal processing unit in order to uniformly conduct a heat process to a plurality of wafers. However, it is difficult to always make a state in the thermal processing unit uniform with respect to both time and space.

Therefore, it is necessary to precisely control the thermal processing unit in order to conduct a heat process to a plurality of wafers under a more uniform condition.

The present invention has been made to solve such a problem and it is an object of the present invention to provide a method of determining a control condition for uniformly conducting a heat process to a plurality of wafers by means of a thermal processing unit.

In addition, in a conventional heat processing unit, a stabilization time is required to make a temperature of a substrate stable, for a purpose of conducting a heat process uniformly within a surface of the substrate. Thus, it takes a long time to conduct the heat process by the stabilization time, so that the throughput is deteriorated.

The present invention has been made to solve such a problem and it is an object of the present invention to provide a heat processing unit that can carry out a heat process uniformly within a surface of a substrate even if the stabilization time is shortened.

DISCLOSURE OF THE INVENTION

The present invention is a method of determining a set temperature profile for a method of controlling respective substrate temperatures of a plurality of groups in accordance with respective corresponding set temperature profiles, in a method of heat processing a plurality of substrates that are classified into the plurality of groups, the method of determining a set temperature profile comprising: a first heat processing step of controlling respective substrate temperatures of a plurality of groups in accordance with respective predetermined provisional set temperature profiles for first-batch substrates that are classified into the plurality of groups, and of introducing a process gas to conduct a heat process to form films on the substrates; a first film-thickness measuring step of measuring a thickness of the films formed on the substrates; and a first set-temperature-profile amending step of respectively amending the provisional set temperature profiles based on the measured thickness, in such a manner that a thickness of films formed during a heat process is substantially the same between the plurality of groups; wherein, in the first heat processing step, the provisional set temperature profiles are profiles whose set temperatures change as time passes.

Thickness distribution of the films between the substrates can be made uniform, by amending the provisional set temperature profiles that are profiles whose set temperatures change as time passes.

It is preferable to maintain substantially the same patterns except components of constant terms (offsets) when amending the provisional set temperature profiles. In the case, it becomes difficult for thickness distribution within a substrate to change between before and after the amendment.

Preferably, in the first heat processing step, set temperatures of the provisional set temperature profiles have a substantially constant gradient with respect to time. Steepness of the gradient is a factor that determines temperature distribution within a surface of the substrate. By making the gradient constant, temperature distribution during the heat process and hence distribution of film-forming rate can be made constant with respect to time.

Preferably, in the first film-thickness measuring step, for at least one substrate in each of the plurality of groups, film thickness is measured at a plurality of points of each substrate, and an average of the measured values is obtained as a film thickness of the substrate.

Preferably, in the first set-temperature-profile amending step, averages of ideal set temperatures to be amended are calculated based on a thickness-temperature dependant relationship between the substrate temperatures and the film thickness, and the provisional set temperature profiles are amended based on the averages.

Averages of the set temperatures are factors that correspond to averages of film-growing rates. Thus, it is effective to make film-thickness distribution uniform based on the averages of the set temperatures.

The thickness-temperature dependant relationship can be represented for example by a thickness-temperature coefficient. In addition, as a thickness-temperature dependant relationship, a theoretical equation can be used. Values obtained from experiments can be also used.

Preferably, the present invention is a method of determining a set temperature profile according to claim 1, further comprising after the first set-temperature-profile amending step: a second heat processing step of controlling the respective substrate temperatures of the plurality of groups in accordance with respective amended first set temperature profiles for second-batch substrates that are classified into the plurality of groups, and of introducing a process gas to conduct a heat process to form films on the substrates; a second film-thickness measuring step of measuring a thickness of the films formed on the substrates; and a second set-temperature-profile amending step of respectively amending the first set temperature profiles based on the measured thickness, in such a manner that a thickness of films formed during a heat process is substantially the same between the plurality of groups.

Preferably, in the second set-temperature-profile amending step, averages of ideal set temperatures to be amended are calculated based on a thickness-temperature dependant relationship between the substrate temperatures and the film thickness, and the first set temperature profiles are amended based on the averages.

Preferably, in the second set-temperature-profile amending step, the thickness-temperature dependant relationship between the substrate temperatures and the film thickness is amended based on: averages in time of the provisional set temperature profiles during the first heat processing step, film thickness of the films on the first-batch substrates, averages in time of the first set temperature profiles during the second heat processing step, and film thickness of the films on the second-batch substrates.

Preferably, the second heat processing step, the second film-thickness measuring step and the second set-temperature-profile amending step are repeated at least twice in order thereof.

In addition, the present invention is a method of determining a set temperature profile for a method of controlling respective substrate temperatures of a plurality of groups in accordance with respective corresponding set temperature profiles, in a method of heat processing a plurality of substrates that are classified into the plurality of groups, the method of determining a set temperature profile comprising: a first set-temperature-profile determining step of determining first set temperature profiles, each of which is set for each of a plurality of groups of substrates, in accordance with which films of substantially the same thickness between the plurality of groups are formed on the substrates when a process gas is introduced to conduct a heat process, and whose set temperatures don't change as time passes during the heat process; a second set-temperature-profile determining step of determining second set temperature profiles, each of which is set for each of the plurality of groups of the substrates by amending each first set temperature profile, in accordance with which a film of substantially the same thickness is formed on each of the substrates when a process gas is introduced to conduct a heat process, and whose set temperatures change as time passes during the heat process; and a third set-temperature-profile determining step of determining third set temperature profiles, each of which is set for each of the plurality of groups of the substrates by amending each second set temperature profile, in accordance with which films of substantially the same thickness between the plurality of groups are formed on the substrates when a process gas is introduced to conduct a heat process, and whose set temperatures change as time passes during the heat process.

According to the invention, a control condition that can obtain good film-thickness distribution with respect to both between the plurality of groups of the substrates and within a surface of each of the substrates can be easily determined.

Preferably, the first set-temperature-profile determining step includes: a first heat processing step of controlling respective substrate temperatures of the plurality of groups in accordance with respective predetermined provisional set temperature profiles for first-batch substrates that are classified into the plurality of groups, and of introducing a process gas to conduct a heat process to form films on the substrates; a first film-thickness measuring step of measuring a thickness of the films formed on the substrates; and a first set-temperature-profile amending step of calculating ideal constant set temperatures based on the measured thickness, in such a manner that a thickness of films formed during a heat process is substantially the same between the plurality of groups, and of respectively amending the provisional set temperature profiles based on the ideal constant set temperatures.

In the case, thickness distribution of the films on the substrates can be made uniform between the plurality of groups of the substrates.

Preferably, in the first set-temperature-profile amending step, the ideal constant set temperatures are calculated based on a thickness-temperature dependant relationship between the substrate temperatures and the film thickness.

As the thickness-temperature dependant relationship, a theoretical equation can be used, and also values obtained from experiments can be used.

Preferably, in the first film-thickness measuring step, for at least one substrate in each of the plurality of groups, film thickness is measured at a plurality of points of each substrate, and an average of the measured values is obtained as a film thickness of the substrate.

In addition, preferably, the first set-temperature-profile determining step includes after the first set-temperature-profile amending step: a second heat processing step of controlling the respective substrate temperatures of the plurality of groups in accordance with respective amended provisional set temperature profiles for second-batch substrates that are classified into the plurality of groups, and of introducing a process gas to conduct a heat process to form films on the substrates; a second film-thickness measuring step of measuring a thickness of the films formed on the substrates; and a second set-temperature-profile amending step of calculating again ideal constant set temperatures based on the measured thickness, in such a manner that a thickness of films formed during a heat process is substantially the same between the plurality of groups, and of respectively amending again the amended provisional set temperature profiles based on the ideal constant set temperatures.

Preferably, in the second set-temperature-profile amending step, the ideal constant set temperatures are calculated again based on a thickness-temperature dependant relationship between the substrate temperatures and the film thickness.

Preferably, in the second set-temperature-profile amending step, the thickness-temperature dependant relationship between the substrate temperatures and the film thickness is amended based on: set temperatures of the provisional set temperature profiles during the first heat processing step, film thickness of the films on the first-batch substrates, set temperatures of the amended provisional set temperature profiles during the second heat processing step, and film thickness of the films on the second-batch substrates.

Preferably, the second heat processing step, the second film-thickness measuring step and the second set-temperature-profile amending step are repeated at least twice in order thereof.

Preferably, averages in time of set temperatures of the second set temperature profiles during the heat process are substantially the same as constant set temperatures of the first set temperature profiles during the heat process.

Preferably, set temperatures of the second set temperature profiles during the heat process have a substantially constant gradient with respect to time. Thus, temperature distribution on a surface of the substrate and hence distribution of film-growing rate can be made substantially constant with respect to time.

Preferably, the second set-temperature-profile determining step includes: a third heat processing step of controlling respective substrate temperatures of the plurality of groups in accordance with the respective first set temperature profiles for third-batch substrates that are classified into the plurality of groups, and of introducing a process gas to conduct a heat process to form films on the substrates; a third film-thickness measuring step of measuring a thickness distribution of the films formed on the substrates; and a third set-temperature-profile amending step of respectively amending the first set temperature profiles based on the measured thickness distribution.

In the case, film-thickness distribution can be made uniform within a surface of each of the substrates, while maintaining uniformity in film-thickness distribution between the plurality of groups of the substrates to some extent.

Preferably, the third film-thickness measuring step includes: a step of measuring a film thickness on the substrate near a central portion thereof; and a step of measuring a film thickness on the substrate near a plurality of peripheral portions thereof.

Preferably, the third film-thickness measuring step includes: a step of obtaining the thickness distribution on the substrates as a function of a distance from a substantially center thereof.

Preferably, the function is a function of a square of the distance from the substantially center thereof.

Preferably, the third film-thickness measuring step includes: a step of obtaining the thickness distribution on the substrates as a difference between a film thickness near a central portion thereof and a film thickness near a peripheral portion thereof.

Preferably, in the third set-temperature-profile amending step, a necessary temperature distribution in one substrate that is necessary for forming a film whose thickness is substantially uniform within a surface of the substrate is adapted to be calculated based on a thickness-temperature dependant relationship between the substrate temperatures and the film thickness and the measured thickness distribution.

Since temperature during the heat process is a factor greatly relating to film-growing rate, film-thickness distribution within a surface of each of the substrates can be made uniform, by controlling temperature distribution within the surface of each of the substrates.

As the thickness-temperature dependant relationship, a theoretical equation can be used, and also values obtained from experiments can be used. If averages in time of the set temperatures changing as time passes are used as the temperature, handling is easy.

Preferably, the necessary temperature distribution is represented by a difference between a temperature of the substrate near a central portion thereof and a temperature of the substrate near a peripheral portion thereof.

Preferably, in the third set-temperature-profile amending step, necessary gradients with respect to time of set temperature profiles to be obtained by amended are calculated based on a dependant relationship between gradients with respect to time of set temperature profiles and temperature distribution within the substrate and the necessary temperature distribution, and the first set temperature profiles are adapted to be amended based on the necessary gradients.

Thus, the temperature distribution within the surface of each of the substrates can be suitably controlled, so that the film-thickness distribution within the surface of each of the substrates can be made uniform.

In addition, preferably, the second set-temperature-profile determining step includes after the-third set-temperature-profile amending step: a fourth heat processing step of controlling the respective substrate temperatures of the plurality of groups in accordance with respective amended first set temperature profiles for fourth-batch substrates that are classified into the plurality of groups, and of introducing a process gas to conduct a heat process to form films on the substrates; a fourth film-thickness measuring step of measuring a thickness distribution of the films formed on the substrates; and a fourth set-temperature-pro file amending step of respectively amending again the amended first set temperature profiles based on the measured thickness distribution.

In the case, film-thickness distribution can be adjusted between the plurality of groups of the substrates, while maintaining uniformity in film-thickness distribution within a surface of each of the substrates to some extent.

Preferably, in the fourth set-temperature-profile amending step, a necessary temperature distribution in one substrate that is necessary for forming a film whose thickness is substantially uniform within a surface of the substrate is adapted to be calculated based on a thickness-temperature dependant relationship between the substrate temperatures and the film thickness and the measured thickness distribution.

Preferably, in the fourth set-temperature-profile amending step, the thickness-temperature dependant relationship between the substrate temperatures and the film thickness is amended based on: averages in time of the first set temperature profiles during the third heat processing step, film thickness of the films on the third-batch substrates, averages in time of the amended first set temperature profiles during the fourth heat processing step, and film thickness of the films on the fourth-batch substrates.

Preferably, the fourth heat processing step, the fourth film-thickness measuring step and the fourth set-temperature-profile amending step are repeated at least twice in order thereof.

Preferably, the third set-temperature-profile determining step includes: a fifth heat processing step of controlling respective substrate temperatures of the plurality of groups in accordance with the respective second set temperature profiles for fifth-batch substrates that are classified into the plurality of groups, and of introducing a process gas to conduct a heat process to form films on the substrates; a fifth film-thickness measuring step of measuring a thickness of the films formed on the substrates; and a fifth set-temperature-profile amending step of calculating averages of set temperatures based on the measured thickness, in such a manner that a thickness of films formed during a heat process is substantially the same between the plurality of groups, and of respectively amending the second set temperature profiles based on the averages of set temperatures.

In addition, the present invention is a heat processing unit comprising: a processing chamber in which a substrate is contained; a heater that heats the substrate contained in the processing chamber; a gas-introducing part that introduces a process gas into the processing chamber in order to conduct a heat process to the substrate; and a controller that controls the heater and the gas-introducing part, in accordance with a process recipe including a set temperature profile defining a relationship between a passage of time and a set temperature, in order to conduct the heat process to the substrate, wherein: the set temperature profile is defined in such a manner that, with respect to the substrate during the heat process, both a central-high-temperature state wherein a temperature near a central portion thereof is higher than a temperature near a peripheral portion thereof and a peripheral-high-temperature state wherein a temperature near the peripheral portion thereof is higher than a temperature near the central portion thereof can appear.

According to the invention, during the heat process, there are both the central-high-temperature state wherein a temperature near the central portion of the substrate is higher and the peripheral-high-temperature state wherein a temperature near the peripheral portion thereof is higher. The central-high-temperature state and the peripheral-high-temperature state may cancel out each other, so that the central temperature and the peripheral temperature may approach each other in their averages with respect to time. Thus, even if a stabilization time is shortened, it is easy to uniformly conduct the heat process to a surface of the substrate.

Preferably, the set temperature profile is defined in such a manner that, with respect to the substrate during the heat process, an average in time of the temperature near the central portion thereof is substantially the same as an average in time of the temperature near the peripheral portion thereof. Since the average in time of the central temperature is substantially the same as the average in time of the peripheral temperature, it is easy to secure uniformity of the heat process to the surface of the substrate.

Preferably, the set temperature profile is defined to change as time passes during the heat process.

Preferably, the set temperature profile is defined to change as time passes before the heat process.

In addition, the present invention is a heat processing method of conducting a heat process to a substrate using a heat processing unit including: a processing chamber in which a substrate is contained; a heater that heats the substrate contained in the processing chamber; a gas-introducing part that introduces a process gas into the processing chamber in order to conduct a heat process to the substrate; and a controller that controls the heater and the gas-introducing part, in accordance with a process recipe including a set temperature profile defining a relationship between a passage of time and a set temperature, in order to conduct the heat process to the substrate; the method comprising: a heat processing step of heating the substrate and introducing the process gas into the processing chamber, in accordance with the process recipe, wherein: the heat processing step has: a central-high-temperature step wherein a temperature near a central portion of the substrate is higher than that near a peripheral portion thereof, and a peripheral-high-temperature step wherein a temperature near the peripheral portion of the substrate is higher than that near the central portion thereof.

According to the invention, the central-high-temperature state and the peripheral-high-temperature state may cancel out each other. Thus, even if a stabilization time is shortened, it is easy to secure uniformity of the heat process within a surface of the substrate.

The set temperature profile may be defined to change as time passes, during the heat processing step.

The set temperature profile may be defined to go down as time passes, during the heat processing step. In the case, preferably, the central-high-temperature step is conducted after the peripheral-high-temperature step. Because, if heating of the substrate and heat radiation from the substrate are conducted from the peripheral portion of the substrate, the peripheral temperature of the substrate goes down more rapidly than the central temperature, as the set temperatures go down as time passes.

Alternatively, the set temperature profile may be defined to go up as time passes, during the heat processing step. In the case, preferably, the peripheral-high-temperature step is conducted after the central-high-temperature step. Because, if heating of the substrate and heat radiation from the substrate are conducted from the peripheral portion of the substrate, the peripheral temperature of the substrate goes up more rapidly than the central temperature, as the set temperatures go up as time passes.

Preferably, an average in time of the temperature near the central portion of the substrate is substantially the same as an average in time of the temperature near the peripheral portion thereof, during the heat processing step. This can lead to securing of a uniform heat process within a surface of the substrate.

Preferably, the temperature near the peripheral portion of the substrate is an average of temperatures at a plurality of points near the peripheral portion of the substrate.

Preferably, the process gas is introduced into the processing chamber at a substantially constant density, during the heat processing step. In the case, it is easy to conduct a uniform heat process within a surface of the substrate.

Preferably, the process gas is introduced into the processing chamber under a substantially constant pressure, during the heat processing step. In the case, it is easy to conduct a uniform heat process within a surface of the substrate.

In addition, a heat processing method can further comprise a heating step whose set temperature profile is defined to go up as time passes, before the heat processing step.

In the case, a heat processing method can further comprise a change-in-time set temperature step whose set temperature profile is defined to change as time passes, between the heating step and the heat processing step. Alternatively, a heat processing method can further comprise a constant set temperature step whose set temperature profile is defined not to change as time passes, between the heating step and the heat processing step.

In addition, the present invention is a method of heat processing a substrate, comprising: a heating step of raising both a central temperature near a central portion of the substrate and a peripheral temperature near a peripheral portion of the substrate by heating the substrate by means of a thermal output within a first range; and a heat processing step of forming a film on the substrate while lowering both the central temperature and the peripheral temperature by heating the substrate from a periphery thereof in a process gas atmosphere by means of a thermal output within a second rage, which is smaller than the thermal output within the first range, the heat processing step having a central-high-temperature step wherein the central temperature of the substrate is higher than the peripheral temperature and a peripheral-high-temperature step wherein the peripheral temperature is higher than the central temperature.

According to the invention, even if a stabilization step between the heating step and the heat processing step (film-forming step) is shortened, or even if a stabilization step is not provided, it is easy to secure uniformity of the heat process within a surface of the substrate.

In addition, the present invention is a recording medium in which a process recipe is recorded, the process recipe including a set temperature profile defining a relationship between a passage of time and a set temperature during a heat process, wherein: a heat processing step wherein the substrate is heated and wherein a process gas is introduced into a processing chamber containing the substrate in accordance with the process recipe has: a central-high-temperature step wherein a temperature near a central portion of the substrate is higher than that near a peripheral portion thereof, and a peripheral-high-temperature step wherein a temperature near the peripheral portion of the substrate is higher than that near the central portion thereof.

BRIEF DESCRIPTION OF THE DRAWINGS

FIG. 1 is a schematic sectional view of an embodiment of a vertical thermal processing system according to the present invention;

FIG. 12 are graphs showing an example of a relationship between film-thickness within a surface of the wafer and distances from the center of the wafer, and an example of temperature distribution within the surface of the wafer for making the film-thickness uniform within the surface of the wafer;

BEST MODE FOR CARRYING OUT THE INVENTION

A vertical thermal processing system in a preferred embodiment according to the present invention will be described with reference to the accompanying drawings.

Figure 2:
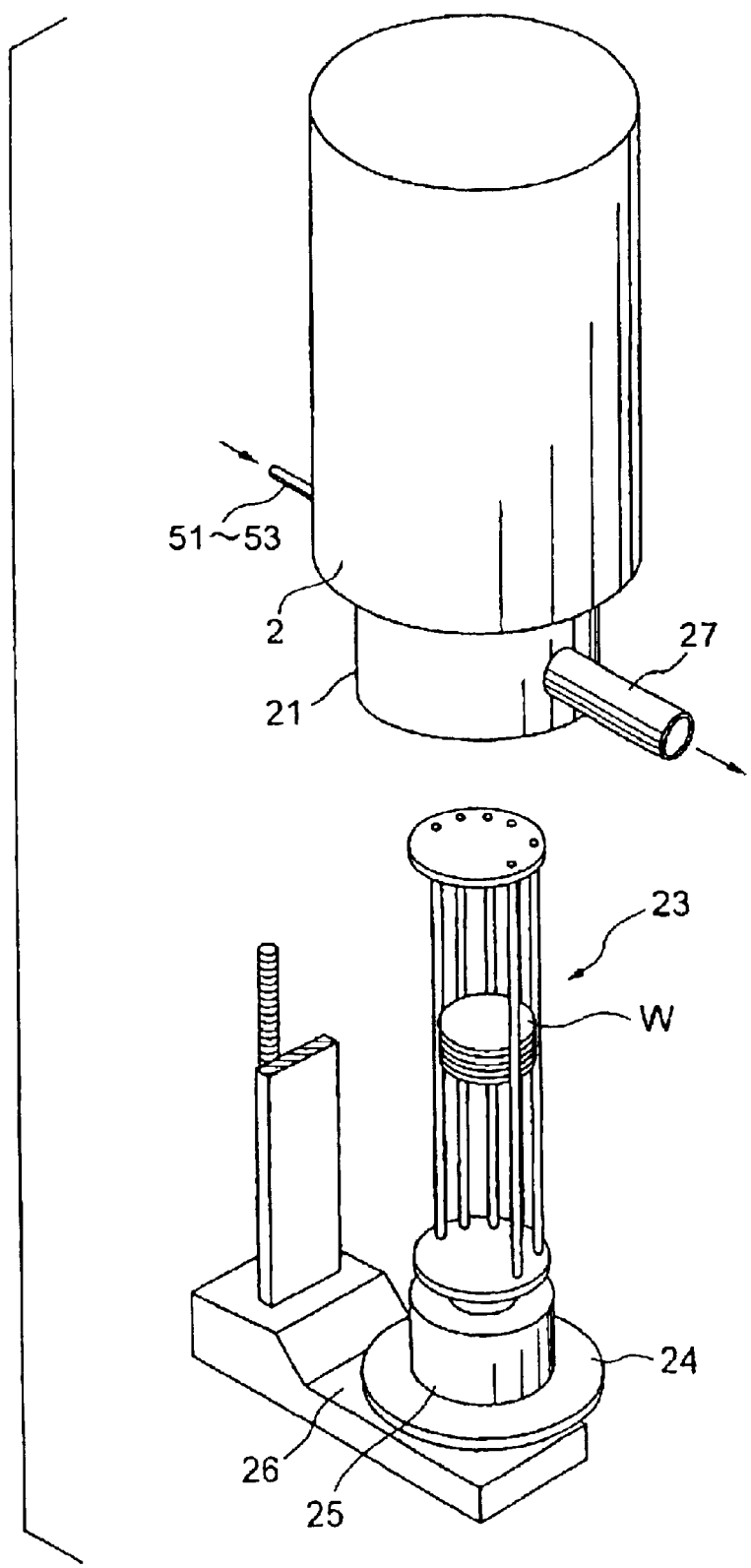
FIG. 2 is a schematic perspective view of the embodiment of the vertical thermal processing system according to the present invention.

FIGS. 1 and 2 are a schematic sectional view and a schematic perspective view, respectively, of a vertical thermal processing system in a preferred embodiment according to the present invention.

As shown in FIG. 1, the vertical thermal processing system is provided with a double-wall reaction tube 2 including an inner tube 2a of, for example, quartz and an outer tube 2b of, for example, quartz. A tubular manifold 21 of a metal is connected to the lower end of the reaction tube 2.

The inner tube 2a has open upper and lower ends and is supported on projections projecting from the inner surface of the manifold 21. The outer tube 2b has a closed upper end and a lower end provided with a flange. The flange of the outer tube 2b is joined hermetically to the lower surface of a base plate 22 and the upper surface of the manifold 21.

As shown in FIG. 2, many semiconductor wafers W (substrates to be processed), for example 150 semiconductor wafers, are supported in a horizontal tier-like manner at vertical intervals on a wafer boat 23, i.e., a wafer holding device, in the reaction tube 2. The wafer boat 23 is held on a heat insulating tube (heat insulating member) 25 held on a cover 24.

Monitor wafers W1 to W5 are distributed on the wafer boat 23 to monitor process conditions.

The cover 24 is mounted on a boat elevator 26 for carrying the wafer boat 23 into and carrying the same out of the reaction tube 2. When raised to an upper limit position, the cover 24 closes the lower open end of the manifold 21, i.e., the open lower end of a processing vessel consisting of the reaction tube 2 and the manifold 21.

As shown in FIG. 1, a heater 3 provided with, for example, resistance-heating elements surrounds the reaction tube 2. The heater 3 is divided into five heating segments. That is, power controllers 41 to 45 control the respective heat generating rates of the heating segments 31 to 35 individually, respectively. The reaction tube 2, the manifold 21 and the heater 3 constitute a heating furnace.

Inner temperature sensors $S1_{in}$ to $S5_{in}$, such as thermocouples, are disposed on the inner surface of the inner tube 2a at positions respectively corresponding to the heating segments 31 to 35. Outer temperature sensors $S1_{out}$ to $S5_{out}$, such as thermocouples, are disposed on the outer surface of the outer tube 2b at positions respectively corresponding to the heating segments 31 to 35.

It can be thought that the inside of the inner tube 2a is divided into five zones (zones 1 to 5) correspondingly to the heating segments 31 to 35. Then, the wafers can be classified into five groups G1 to G5 correspondingly to respective locations where the wafers are arranged (zones 1 to 5). The whole groups G1 to G5 is called a batch. That is, all of the wafers arranged in the reaction tube 2 and placed on the wafer boat 23 form one batch to be thermally processed together at a time.

Each of the above monitor wafers W1 to W5 is arranged in each of the groups G1 to G5 (correspondingly to each of the zones 1 to 5). That is, the monitor wafers W1 to W5 are wafers (substrates) representing the groups G1 to G5, respectively, and correspond to the zones 1 to 5 in a one-to-one manner. Normally, the same wafers (semiconductor wafers) as the product wafers are used as the monitor wafers W1 to W5, and their temperatures become objects to be estimated. As described below, the temperatures of the monitor wafers W1 to W5 are estimated from measurement signals provided by the temperature sensors $S1_{in}$ to $S5_{in}$ and $S1_{out}$ to $S5_{out}$.

As shown in FIG. 1, plural gas supply pipes are extended in the manifold 21 to supply gases into a space defined by the inner tube 2a. FIG. 1 shows only the two gas supply pipes 51 and 52. Flow controllers 61 and 62 for controlling the flow rate of gases, such as mass flow controllers, and valves (not shown) are placed in the gas supply pipes 51 and 52. A discharge pipe 27 is connected to the manifold 21 to exhaust a gas from the space between the inner tube 2a and the outer tube 2b. The discharge pipe 27 is connected to a vacuum pump, not shown. The discharge pipe 27 is provided with a pressure regulating unit 28 including, for example, a butterfly valve for regulating the pressure in the reaction tube 2 and/or a valve operating device.

The vertical thermal processing system includes a controller 100 for controlling process parameters including the temperature of a processing atmosphere created in the reaction tube 2 and the pressure in the reaction tube 2 and the flow rates of gases. Temperature measurement signals provided by the temperature sensors $S1_{in}$ to $S5_{in}$ and $S1_{out}$ to $S5_{out}$ are inputted to the controller 100. The controller 100 outputs control signals to the power controllers 41 to 45 for controlling power to be supplied to the heater 3, the pressure regulating unit 28 and the flow regulators 61 and 62.

Figure 3:
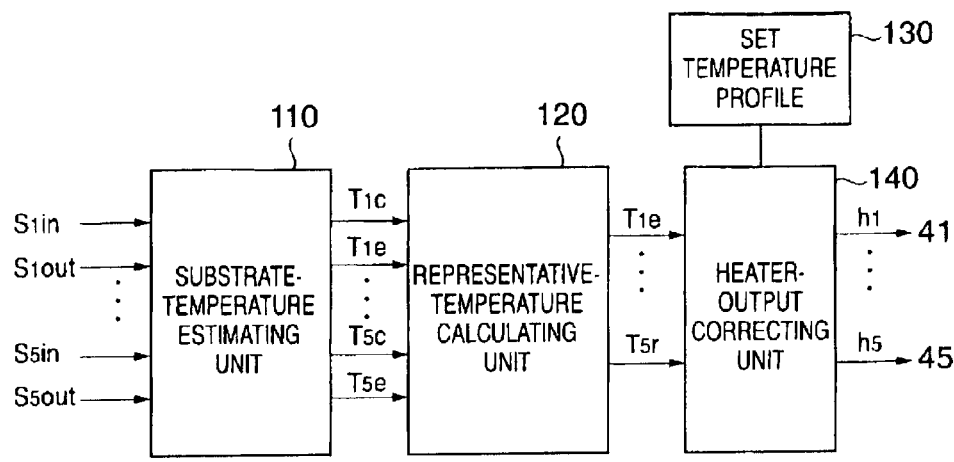
FIG. 3 is a block diagram showing detail of a controller included in the vertical thermal processing system in the embodiment shown in FIGS. 1 and 2.

FIG. 3 is a block diagram showing detail of a part relating to a control of the heater 3, included in the controller 100. As shown in FIG. 3, the controller 100 includes: a substrate temperature estimating unit 110 that outputs central temperatures T1c to T5c near respective central portions of the monitor wafers W1 to W5 and peripheral temperatures T1e to T5e near respective peripheral portions of the monitor wafers W1 to W5 which are estimated based on the measurement signals provided by the temperature sensors $S1_{in}$ to $S5_{in}$ and $S1_{out}$ to $S5_{out}$; a representative temperature calculating unit 120 that calculates respective representative temperatures T1r to T5r of the monitor wafers W1 to W5 from the central temperatures T1c to T5c and the peripheral temperatures T1e to T5e of the monitor wafers W1 to W5; and a heater output determining unit 140 that determines heater outputs h1 to h5 based on the representative temperatures T1r to T5r of the monitor wafers W1 to W5 and set temperature profiles stored in a set-temperature-profile storage unit 130. The heater outputs h1 to h5 determined by the heater output determining unit 140 are transferred to the power controllers 41 to 45 as control signals.

The set temperature profile represents a relationship between a passage of time and a set temperature (a temperature at which the wafer W should be). An example of the set temperature profile is shown in FIG. 4.

Figure 4:
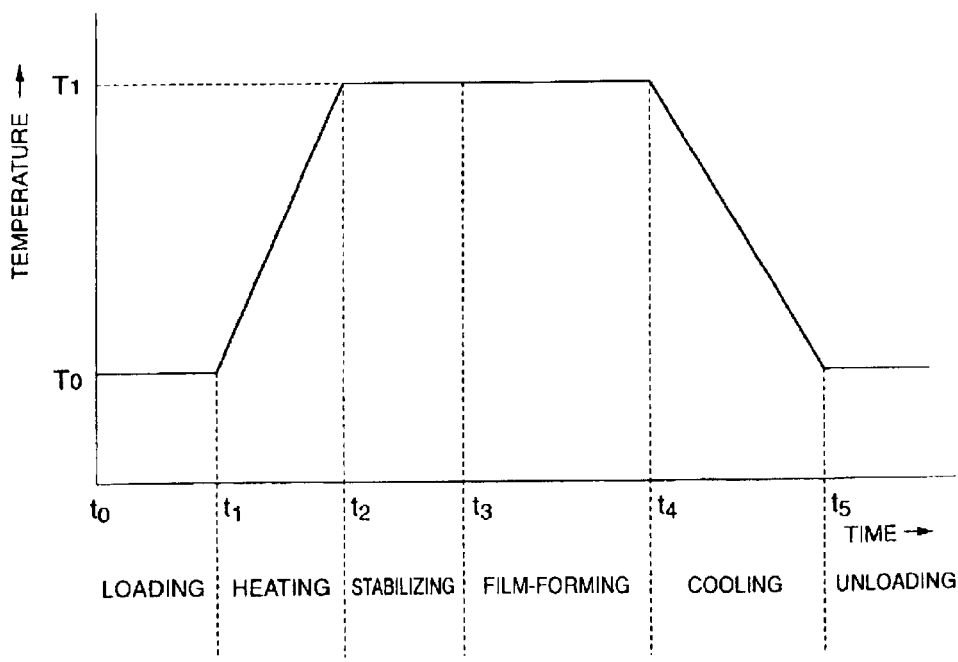
FIG. 4 is a graph showing an example of a set temperature profile for the vertical thermal processing system in the embodiment shown in FIGS. 1 and 2.

FIG. 4 is a graph showing the set temperature profile of the embodiment. As shown in FIG. 4, in the set temperature profile;

(A) From a time t0 to a time t1, the set temperature is maintained at T0. At that time, the wafer boat 20 holding the wafers W is transferred into the vertical heat-processing furnace 10 (loading step).

(B) From the time t1 to a time t2, the set temperature is raised from T0 to T1 at a constant rate (heating step).

(C) From the time t2 to a time t3, the set temperature is maintained at T1. With respect to actual temperatures of the wafers W, because of thermal inertia, it may take some time until the temperatures become constant after the set temperature has been made constant. Thus, until the wafer temperatures are stabilized, the subsequent step is waited (stabilizing step).

(D) From the time t3 to time a t4, the set temperature is maintained at T1. At that time, a process gas such as $SiH_2Cl_2$ and $NH_3$ is introduced into the vertical heat-processing furnace 10 and a film-forming process of an SiN film is conducted for example by means of CVD (film-forming step).

The set temperature during the film-forming step is a constant set temperature. As described below, the set temperature may be changed during the film-forming step. This is called a change-in-time set temperature.

(E) From the time t4 to a time t5, the set temperature is lowered from T1 to T0 at a constant rate (cooling step).

(F) After the time t5, the set temperature is maintained at T0. At that time, the wafer boat 20 holding the wafers W is transferred out from the vertical heat-processing furnace 10 (unloading step).

The set temperature profile can be represented by directly specifying the temperature correspondingly to the passage of time as described above, or by specifying a change rate of the temperature such as a heating rate, or by specifying the heater output, or by any other various manners. The representing manner is not limited, and only has to make the passage of time and the temperature of the wafer W correspond to each other.

The set temperature profile is a part of a process recipe that determines the whole heat process to the wafers W. In the process recipe, additionally to the set temperature profile, steps of discharging the atmosphere from the inside of the vertical thermal processing furnace 10 and introducing the process gas thereinto are represented correspondingly to the passage of time.

The most important step among the whole heating process is the film-forming step (heat processing step). A part describing the film-forming step in the process recipe is called a film-forming-step describing part (heat-processing-step describing part).

Figure 5:
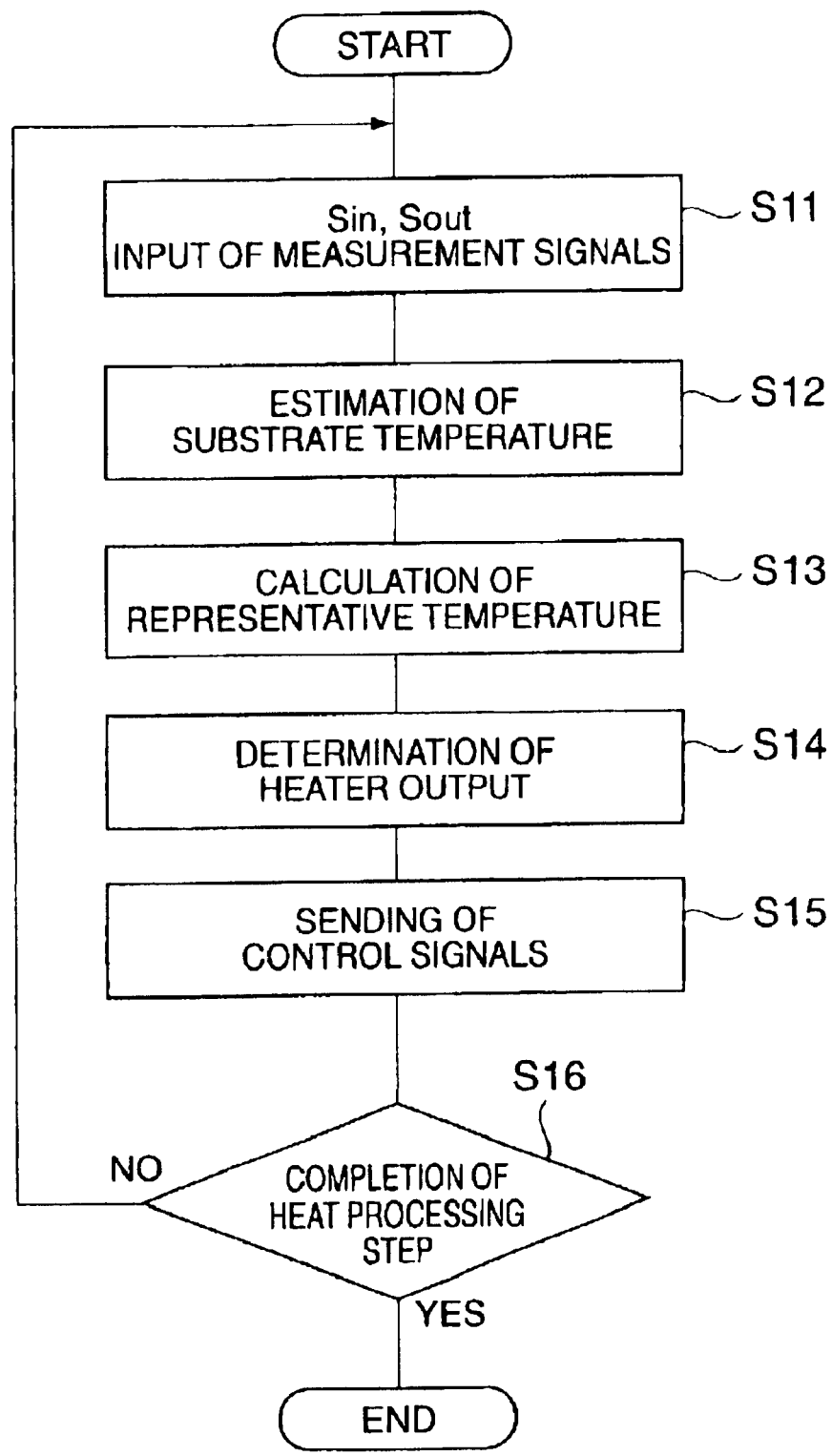
FIG. 5 is a flow chart showing a control procedure to be carried out by the controller of the vertical thermal processing system in the embodiment shown in FIGS. 1 and 2.

FIG. 5 is a flow chart showing a control procedure to be carried out by the controller 100 to control the heater 3. With reference to the flow chart, a temperature-control procedure of the vertical heat-processing furnace 10 is explained.

(A) When the heat process is started, the measurement signals of the temperature sensors $S_{in}$ ($S1_{in}$ to $S5_{in}$) and $S_{out}$ ($S1_{out}$ to $S5_{out}$) are read by the substrate temperature estimating unit 110 (S11).

(B) The substrate temperature estimating unit 110 estimates the central temperatures T1c to T5c and the peripheral temperatures T1e to T5e of the monitor wafers $W_1$ to $W_5$ from the measurement signals of the temperature sensors $S_{in}$ and $S_{out}$ (S12).

The following Expressions (1) and (2) known in the field of control engineering are used for the estimation.

$$X(t+1)=A \cdot x(t)+B \cdot u(t) \quad (1)$$

$$Y(t)=C \cdot x(t)+u(t) \quad (2)$$

where:
t: time
x(t): n-dimensional state vector
y(t): m-dimensional output vector
u(t): r-dimensional input vector
A, B, C: n×n, n×r and m×n constant matrices Expressions (1) and (2) are called a state equation and an output equation, respectively. The output vector y(t) can be obtained by solving the simultaneous equations of Expressions (1) and (2).

In this embodiment, the input vector u(t) represents the measurement signals provided by the temperature sensors $S1_{in}$ to $S5_{in}$ and the temperature sensors $S1_{out}$ to $S5_{out}$. The output vector y(t) represents the central temperatures T1c to T5c and the peripheral temperatures T1e to T5e.

In Expressions (1) and (2), the measurement signals provided by the temperature sensors $S_{in}$ and $S_{out}$ and the central temperatures Tc and the peripheral temperatures Te are in a multi-input-output relation. The heating segments 31 to 35 of the heater 3 corresponding to the zones 1 to 5 do not affect only the corresponding monitor wafers $W_1$ to $W_5$ but have some influence on all the monitor wafers $W_1$ to $W_5$.

The following expressions (3) and (4) taking into consideration noise may be used as state equations.

$$X(t+1)=A \cdot x(t)+B \cdot u(t)+K \cdot e(t) \quad (3)$$

$$Y(t)=C \cdot x(t)+D \cdot u(t)+e(t) \quad (4)$$

where:
t: time
x(t): n-dimensional state vector
y(t): m-dimensional output vector
u(t): r-dimensional input vector
e(t): m-dimensional noise vector
A, B, C, D, K: n×n, n×r and m×n, m×m and n×m constant matrices The constant matrices A, B, C and D dependent on the thermal characteristics of the thermal processing system may be obtained by, for example, a subspace method.

At first, the measurement signals provided by the temperature sensors $S1_{in}$ to $S5_{in}$ and $S1_{out}$ to $S5_{out}$ and data representing the central point temperatures T1c to T5c and the peripheral point temperatures T1e to T5e are obtained. The constant matrices A, B, C and D can be found by processing the data by, for example, a software Matlab manufactured by The Math Works Inc. and commercially available from Cybernet System Co.

The data can be obtained by gradually changing the outputs of the heating segments 31 to 35 and simultaneously measuring the measurement signals provided by the temperature sensors $S1_{in}$ to $S5_{in}$ and $S1_{out}$ to $S5_{out}$, the central point temperatures T1c to T5c and the peripheral point temperatures T1e to T5e, which vary with time. The central temperatures T1c to T5c and the peripheral temperatures T1e to T5e can be measured by using thermocouples connected to the monitor wafers.

Usually, plural combinations of the thus obtained constant matrices A, B, C and D are possible. A combination of the constant matrices A, B, C and D that makes calculated central temperatures T1c to T5c and peripheral temperatures T1e to T5e (which may be calculated by using the simultaneous equations of Expressions (3) and (4)) coincide satisfactorily with measured temperatures is selected (evaluation of the model).

After the combination of the constant matrices A, B, C and D has been selected, the central temperatures T1c to T5c and the peripheral temperatures T1e to T5e can be calculated by processing the measurement signals of the temperature sensors $S1_{in}$ to $S5_{in}$ and $S1_{out}$ to $S5_{out}$ by using the simultaneous equations of Expressions (1) and (2) or Expressions (3) and (4).

(C) The representative-temperature calculating unit 120 calculates representative temperatures T1r to T5r representing the temperatures of the monitor wafers $W_1$ to $W_5$ on the basis of the central temperatures T1c to T5c and the peripheral temperatures T1e to T5e (S13).

The representative temperature T4 may be calculated by using the following Expression (5).

$$Tr=Tc \cdot x+Te \cdot (1-x) \quad (5)$$

where x is a weight meeting 0<x<1.

As the weight x, taking into consideration the temperature distribution on the wafer W, a value such that the representative temperature Tr properly represents the temperature of the wafer W is adopted. Concretely, the weight x may be for example ⅓.

(D) The heater output determining unit 130 determines output values h1 to h5 to the power controllers 41 to 45 on the basis of the representative temperatures T1r to T5r and the set temperature profiles (S14).

The heater outputs h1 to h5 may be determined correspondingly to differences between the set temperatures Tsp and the representative temperatures Tr (Tsp−Tr). Alternatively, they may be determined correspondingly to changing rates of the temperature such as heating rates.

(E) The heater output determining part 140 outputs the finally-determined heater outputs h1 to h5 to the power controllers 41 to 45 as the control signals (S15), and hence the respective outputs of the heating segments 31 to 35 are controlled.

(F) If the heat process has not been completed, the procedure returns to step S11 to repeat the temperature control operation for controlling the temperature of the semiconductor wafer W (S16).

A loop of steps S11 to S16 is repeated at a period in the range of 1 to 4 seconds.

Next, a determining method of a set temperature profile in the thermal processing system according to the embodiment is explained.

Figure 6:
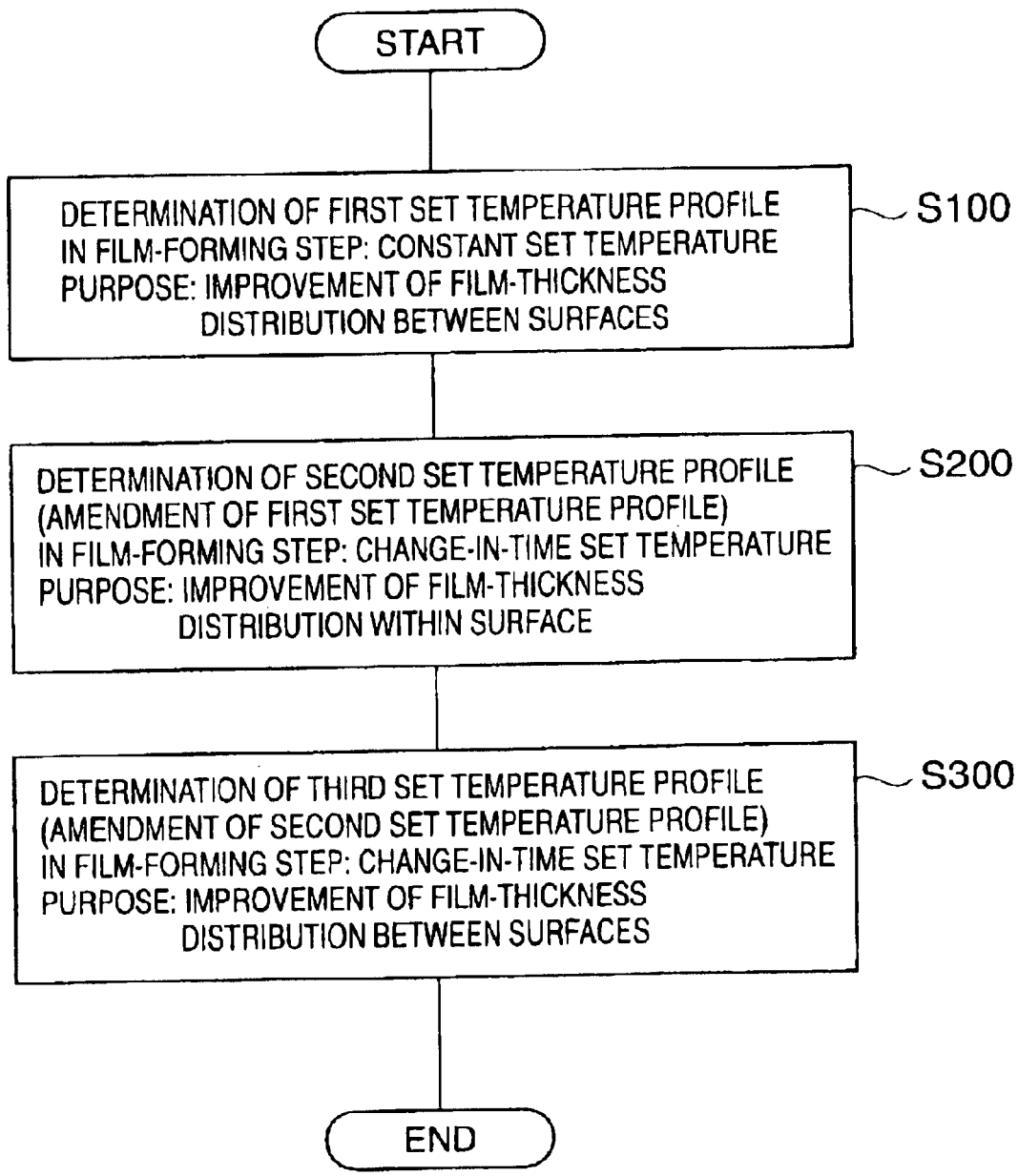
FIG. 6 is a flow chart schematically showing a determining procedure of a set temperature profile in the embodiment shown in FIGS. 1 and 2.

FIG. 6 is a flow chart schematically showing a determining procedure of a set temperature profile. As shown in FIG. 6, the determining procedure of a set temperature profile in the embodiment is roughly divided into 3 steps.

(A) A first set temperature profile is determined in such a manner that film-thickness distribution between the plurality of groups G1 to G5 of the substrates is good (S100).

Herein, the first set temperature profile is a profile whose set temperature is constant during the film-forming step, and is determined for each of the monitor wafers W1 to W5. Thus, films having substantially the same thickness can be formed on the substrates (for example, the monitor wafers W1 to W5) in the plurality of groups.

(B) The first set temperature profile is amended, and a second set temperature profile is determined in such a manner that film-thickness distribution within a surface of each wafer (substrate) is good (S200).

Herein, the second set temperature profile is a profile whose set temperature is a change-in-time set temperature during the film-forming step. Thus, a film having a substantially uniform thickness within the same substrate can be formed.

It is preferable that the second set temperature profile is determined for a substrate in each of the plurality of groups (for example for each of the monitor wafers W1 to W5). However, more simply, it is possible to determine the second set temperature profile for a representative substrate (for example for the monitor wafer W3).

(C) The second set temperature profile is amended, and a third set temperature profile is determined in such a manner that film-thickness distribution between the plurality of groups of the substrates is good (S300).

Herein, the third set temperature profile is a profile whose set temperature is a change-in-time set temperature during the film-forming step, similarly to the second set temperature profile. Since the first set temperature profile has been amended into the second set temperature profile, film-thickness distribution between the plurality of groups of the substrates, which has been good with the first set temperature profile, may become ununiform. Thus, the second set temperature profile is amended to make it possible again to form a film having substantially the same thickness on the substrates of the plurality of groups (for example on the monitor wafers W1 to W5).

(Detail of the Determining Step of the First Set Temperature Profile)

The detail of the determining step of the first set temperature profile S100 is explained.

Figure 7:
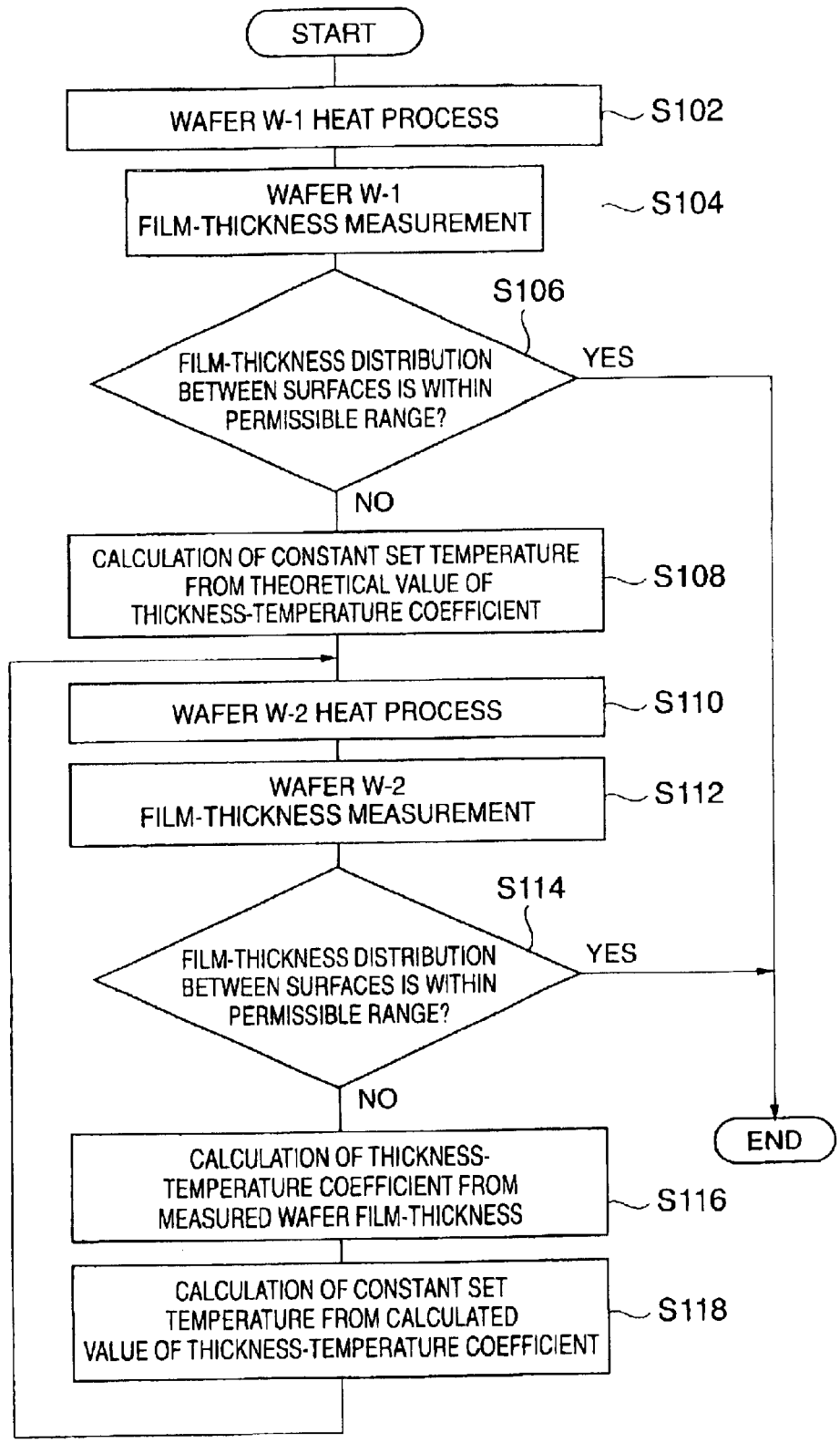
FIG. 7 is a flow chart showing detail of a determining procedure of a first set temperature profile in the embodiment shown in FIGS. 1 and 2.

FIG. 7 is a flowchart showing the detail of the determining procedure of the first set temperature profile.

(A) At first, in accordance with a predetermined set temperature profile, many substrates (wafers W-1) consisting of a plurality of groups and forming a first batch undergo a heat process (S102). Then, thickness of films formed on the substrates of the plurality of groups (wafers W-1) is measured (S104).

The substrates of the plurality of groups of the first batch (wafers W-1) are for example monitor wafers W1-1 to W5-1.

The predetermined set temperature profile is a profile whose set temperature is a constant set temperature during the film-forming step wherein a process gas is introduced to form a film. Herein, a constant set temperature having the same value is used for the wafers W-1 of the first batch. An example of the predetermined set temperature profile is shown in FIG. 4.

A thickness measuring instrument such as an ellipsometer can be used to measure the thickness of the films. The measurement of the thickness may be conducted at one point on each wafer W-1. However, it is preferable to measure the film-thickness at a plurality of points on each wafer W-1 and to calculate an average thereof as a thickness of each wafer W-1.

Figure 8:
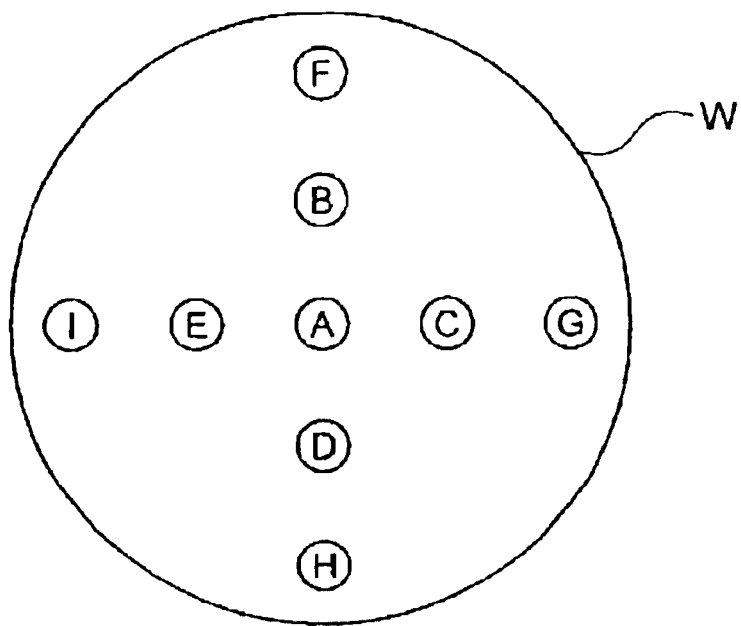
FIG. 8 is a view showing an example of measurement points for measuring a thickness of a film on a wafer.

An example of the measurement points is shown in FIG. 8. In FIG. 8, nine measurement points are set on a wafer W, which consists of a measurement point A near a center of a wafer W, four measurement points F to I near a periphery of the wafer W and four measurement points B to E between the center and the periphery of the wafer W. The measurement points I, E, A, C and G and the measurement points F, B, A, D and H are aligned on a line, respectively.

Figure 9:
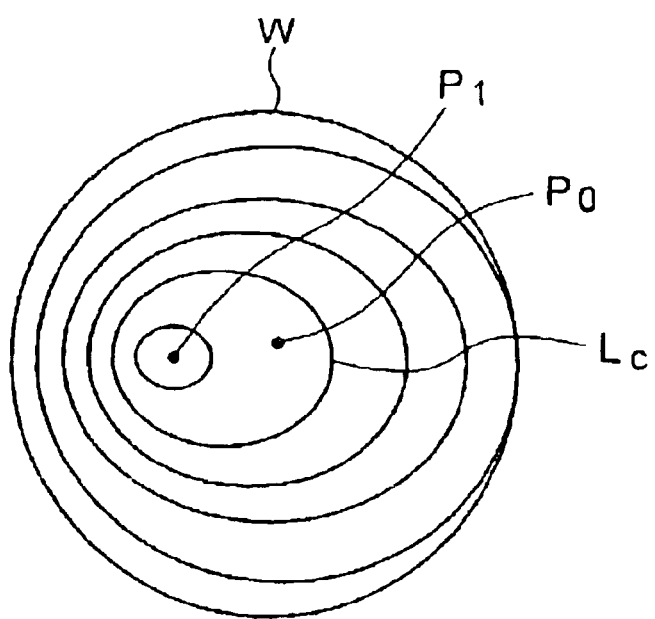
FIG. 9 is a view showing an example of thickness distribution of the film on the wafer.

If there is a film-thickness distribution on the wafer W-1, it is preferable to make the measurement point A coincide with a center of the film-thickness distribution. An example of the film-thickness distribution on the wafer W is shown in FIG. 9. In FIG. 9, a shape center P0 with respect to a shape of the wafer W does not coincide wit a film-thickness-distribution center P1 with respect to a film-thickness distribution on the wafer W. Herein, Lc represents contour lines of the film-thickness. The difference between the shape center P0 and the film-thickness-distribution center P1 may be often caused by a gap between an arrangement position of the wafer W and a thermal center of the thermal processing system. In such a case, it is preferable to cause the arrangement position of the wafer W to coincide with the thermal center of the thermal processing system. Alternatively, it is preferable to cause the position of the measurement point A to coincide with the film-thickness-distribution center P1 by moving the position of the measurement point A from the shape center P0 of the wafer W.

In the following film-thickness measurements, the measurement point A coincides with the film-thickness-distribution center P1.

(B) It is judged whether the measured film-thickness distribution of the wafers W-1 of the plurality of groups is within a predetermined permissible range or not (S106).

For example, the judgement may be conducted by calculating a ratio of film-thickness distribution $\Delta$ based on the following expression (10).

$$\Delta = |D\text{max} - D\text{min}|/[(D\text{max} + D\text{min})/2] \tag{10}$$

where:

Dmax: a maximum of the film-thickness of the wafers W1-1 to W5-1

Dmin: a minimum of the film-thickness of the wafers W1-1 to W5-1

The calculated ratio of film-thickness distribution $\Delta$ is compared with a predetermined permissible value. If the ratio of film-thickness distribution $\Delta$ is not more than the permissible value, the film-thickness distribution is judged to be within the permissible range. Otherwise, the film-thickness distribution is judged not to be within the permissible range.

If the judgement of S106 is Yes, it is unnecessary to amend the predetermined set temperature profile. Thus, the predetermined set temperature profile is set as a first set temperature profile, and the determining step of the first set temperature profile is completed.

(C) If the judgement of S106 is No, a proper value of a constant set temperature during the film-forming step is calculated for each of the groups of the substrates (wafers W-1), based on a thickness-temperature coefficient that represents a relationship between growing rates of the film and temperatures (S108). Then, the set temperature profile is amended base on the calculated constant set temperature.

The calculation of the constant set temperature is conducted in such a manner that the thickness of the films is even between the groups of the substrates of one batch (for example between monitor wafers W1-1 to W5-1), that is, in such a manner that the film-thickness distribution between the groups of the substrates is uniform.

At that time, it is determined first which film-thickness should be a standard of the film-thickness of the wafers W-1. The target film-thickness Dt may be predetermined. Alternatively, the target film-thickness may be an average of the film-thickness of the monitor wafers W1-1 to W5-1.

Then, based on differences between the target film-thickness Dt and measured values of the film-thickness D1 on the wafers of the respective groups (for example, respective film-thickness D11 to D15 on the monitor wafers W1-1 to W5-1) and the thickness-temperature coefficient, respective constant set temperatures Tsp1 (Tsp11 to Tsp15) that are necessary to cause the film-thickness D1 of the wafers W-1 to coincide with the target film-thickness Dt are calculated.

Then, the thickness-temperature coefficient is explained.

It is known that a growing rate of the film-thickness (a film-forming rate) V is represented by the following theoretical expression (20) in a surface rate-determining process wherein the film-forming rate is determined by a reaction process conducted on a surface of the film, such as a CVD (Chemical Vapor Deposition) process.

$$V = C \cdot \exp(-Ea/(kT)) \tag{20}$$

where:

C: a process constant (a constant determined by a film-forming process)

Ea: activation energy (a constant determined by a kind of film-forming process)

k: Boltzmann's constant

T: absolute temperature

If the expression (20) is partial-differentiated by temperature T, the following expression (21) is obtained.

$$\{\partial V/\partial T\}/V = (-Ea/(k \cdot T^2))[1/^\circ C.] \tag{21}$$

Herein, $\{\partial V/\partial T\}/V$ is a thickness-temperature coefficient S, which represents a changing ratio of the film-forming rate as the temperature changes.

The activation energy is determined by a kind of film-forming process (for example, a reaction course of forming a SiN film from reaction gases $SiH_2Cl_2$ and $NH_3$). In the example, the activation energy is 1.8 [eV].

As described above, when the activation energy Ea and the absolute temperature T are substituted for the expression (21), the thickness-temperature coefficient S ($=\{\partial V/\partial T\}/V$) is determined.

Herein, the constant set temperature of the wafers W-1 at S102 is represented by T0, and the constant set temperature necessary to cause the film-thickness of the wafers W-1 to coincide with the target film-thickness Dt is represented by Tsp1. Then, the thickness-temperature coefficient S ($=\{\partial V/\partial T\}/V$) may be represented by the following expression (22).

$$S = (Dt-D0)/[D0 \cdot (Tsp1-T0)] \tag{22}$$

Suppose the expression (21) is equal to the expression (22) and the absolute temperature T in the expression (22) is the constant set temperature T0, the following expression (23) is obtained.

$$Tsp1 = T0 + [(Dt-D0)/D0] \cdot [k \cdot T0^2/Ea] \tag{23}$$

Herein, Ea, k, T0, Dt and D0 are known, so that the constant set temperature Tsp1 can be obtained.

Next, the set temperature profiles are amended based on the constant set temperatures Tsp1 that have been obtained for the respective wafers W-1. An example of the amended set temperature profile is shown in FIG. 10.

Figure 10A:
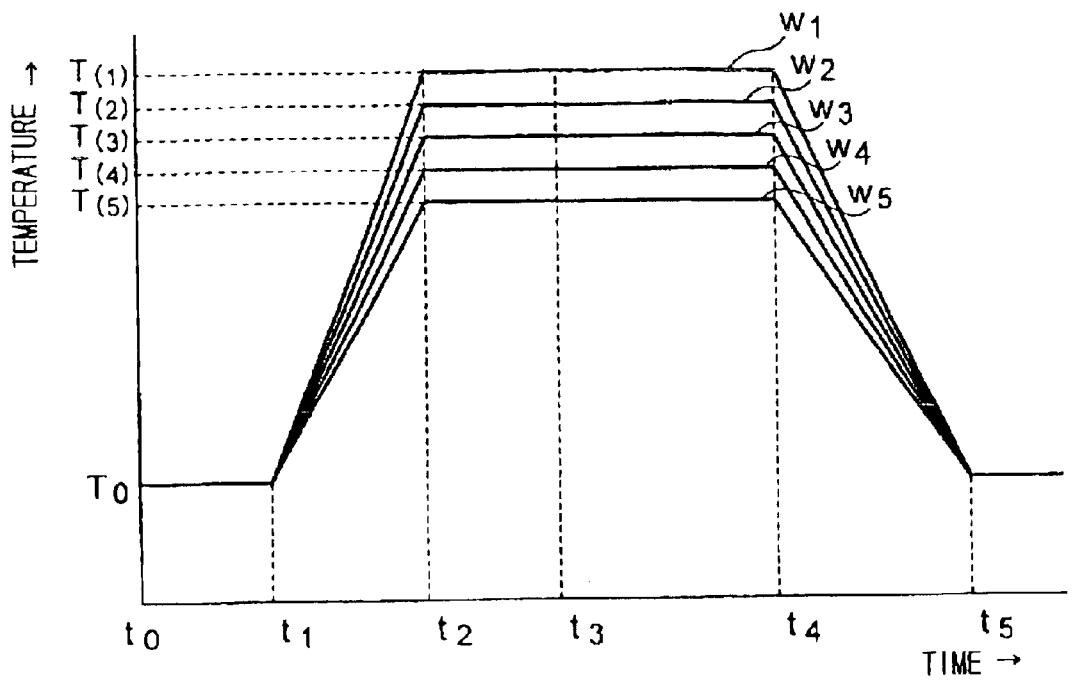
FIG. 10 are graphs showing examples of amended set temperature profiles and an example of a relationship between values of constant set temperature Tsp1 and positions of wafer.
Figure 10B:
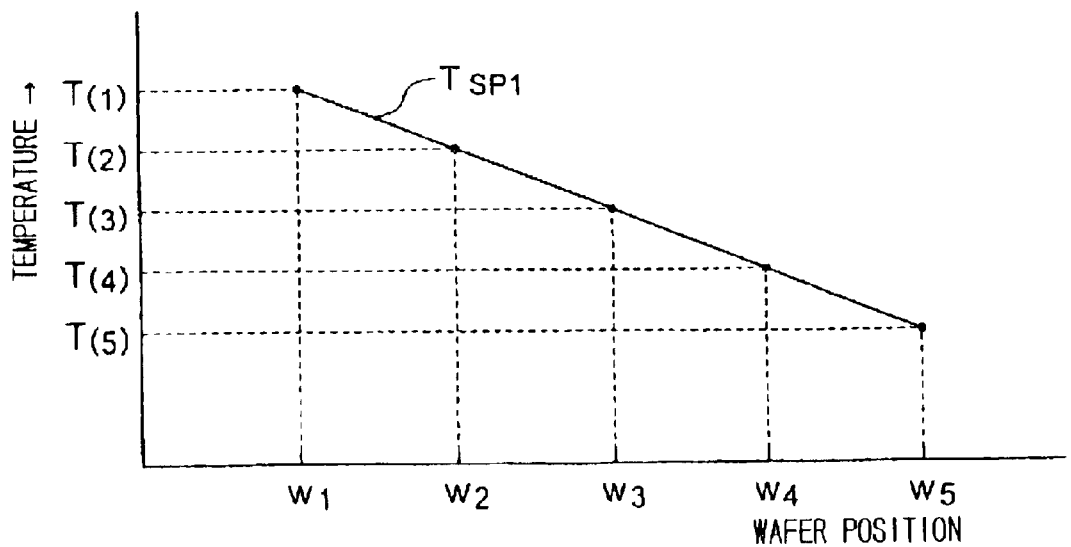

FIG. 10(A) is a graph showing an example of amended set temperature profiles, and FIG. 10(B) is a graph showing an example of a correspondence between values of constant set temperature Tsp1 and positions of wafer. The values of constant set temperature Tsp1 of the monitor wafers W1 to W5 during the film-forming step (from the time t3 to the time t4) are T(1) to T(5).

In the example, the time (t2) to set the constant set temperatures Tsp1 of the monitor wafers W1 to W5 at the T(1) to T(5) is the same. Thus, stabilization time (t3–t2) for the respective monitor wafers W1 to W5 is the same.

However, the stabilization time for the respective wafers W may be not necessarily the same. For example, if heating rates (heating gradients) of the monitor wafers W1 to W5 are the same, the time (t2) when the constant set temperatures Tsp1 of the monitor wafers W1 to W5 respectively reach the T(1) to T(5) is different. In the case, the stabilization time for the respective monitor wafers W1 to W5 is different. Regarding all of the monitor wafers W1 to W5, if the secured stabilization time is longer than a degree, temperature during the film-forming step can be stabilized satisfactorily.

In short, important is the set temperature profile during the film-forming step (heat processing step), and the set temperature profile before and after that may change somehow without any problems.

(D) Next, in accordance with the amended set temperature profile, many wafers W-2 consisting of a plurality of groups and forming a second batch undergo a heat process (S110). Then, thickness of films formed on the wafers W-2 of the plurality of groups is measured (S112). Then, it is judged whether the measured film-thickness distribution of the wafers W-2 of the plurality of groups is within a predetermined permissible range or not (S14).

The heat process, the measurement of the film-thickness and the judgement within the permissible range may be conducted similarly to the above steps S102, S104 and S106.

If the judgement of S114 is Yes, the previously amended set temperature profile is set as a first set temperature profile, and the determining step of the first set temperature profile is completed.

(E) If the judgement of S114 is No, a thickness-temperature coefficient is calculated based on a measurement result about the film-thickness on the wafers W-1 of the first batch and the film-thickness on the wafers W-2 of the second batch (S116). Then, based on the calculated value, a proper value of a constant set temperature during the film-forming step is calculated for each of the groups of the wafers W-2 (S118). Then, the set temperature profile is amended base on the calculated constant set temperature.

The calculation of the thickness-temperature coefficient and the constant set temperature is conducted as follows.

With respect to a zone i, the film-thickness on the wafers Wi-2 of the second batch is represented by D2 and the film-thickness on the wafers Wi-1 of the first batch is represented by D1. At that time, the constant set temperatures are T2 and T1, respectively. Constant set temperatures that are necessary to cause the film-thickness of the wafers W-2 to coincide with the target film-thickness Dt are represented by Tsp.

A measured value of the thickness-temperature coefficient S ($=\{\partial V/\partial T\}/V$) is represented by the following expression (30).

$$S=(D2-D1)/[D1\cdot(T2-T1)] \quad (30)$$

In addition, the relationship between the thickness-temperature coefficient S and the target film-thickness Dt is represented by the following expression (31).

$$S=(Dt-D2)/[D2\cdot(Tsp-T2)] \quad (31)$$

The following expression (32) to calculate a proper constant set temperature Tsp can be obtained by solving the expressions (30) and (31) as coalition equations.

$$Tsp=T2+(T2-T1)\cdot(Dt-D2)\cdot D1/[(D2-D1)\cdot D2] \quad (32)$$

(F) Then, the steps S110 to S118 are repeated to calculate the constant set temperature (to amend the set temperature profile) until the film-thickness distribution between the plurality of groups of the wafers becomes within the permissible range.

(Detail of the Determining Step of the Second Set Temperature Profile)

Next, the detail of the determining step of the second set temperature profile at S200 in FIG. 6 is explained.

Figure 11:
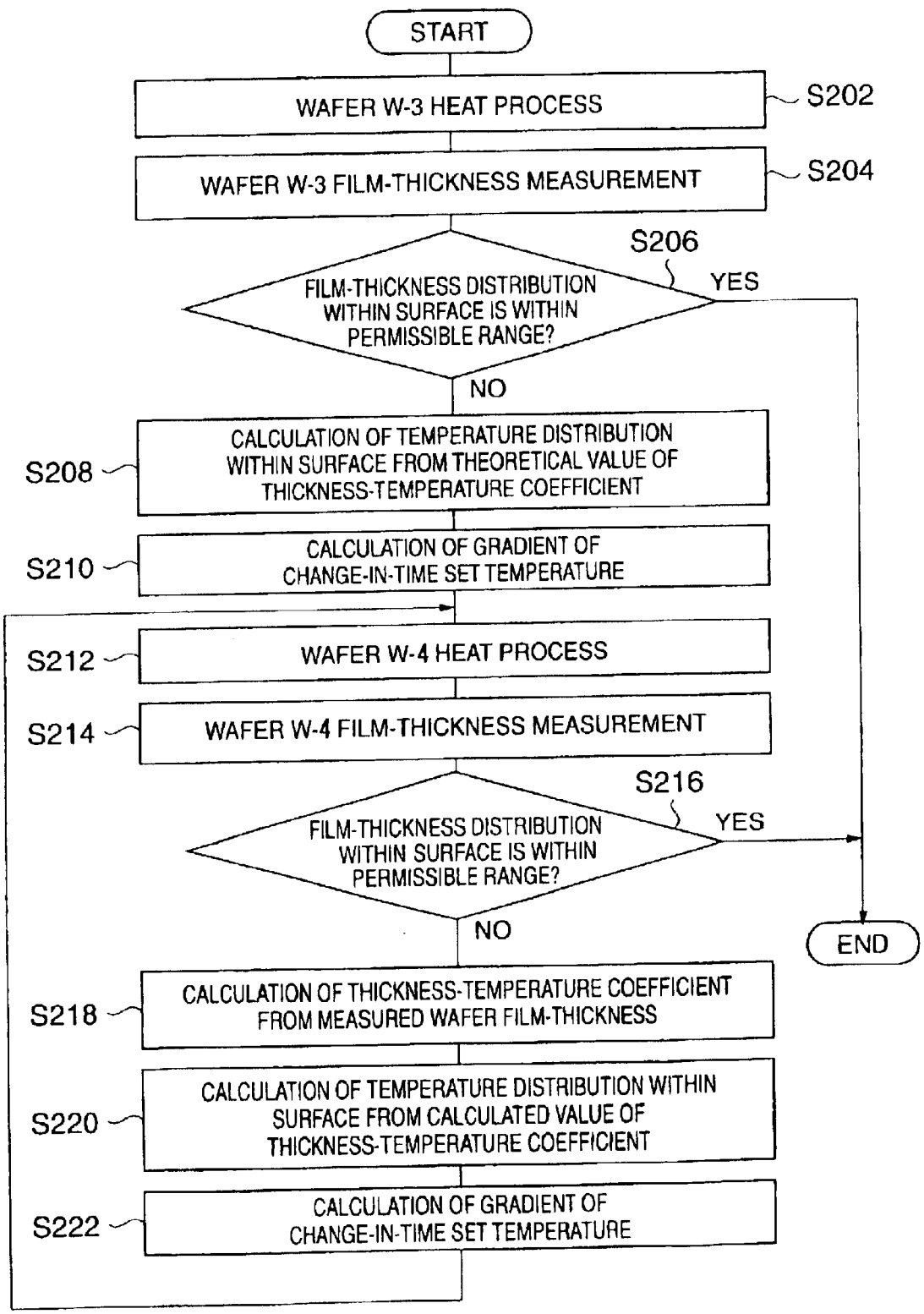
FIG. 11 is a flow chart showing detail of a determining procedure of a second set temperature profile.

FIG. 11 is a flow chart showing the detail of the determining procedure of the second set temperature profile.

(A) At first, in accordance with the first set temperature profile, wafers W-3 of a third batch undergo a heat process (S202). Then, thickness of films formed on the wafers W-3 of the third batch is measured (S204).

Herein, the object of the step is to make the film-thickness distribution uniform within a surface of each wafer W-3. Thus, it is unnecessary to use a plurality of wafers W-3. However, the final object is to make the film-thickness distribution uniform both between the plurality of groups of the wafers and within a surface of each wafer. Therefore, it is preferable to use a plurality of wafers W-3 corresponding to the plurality of groups and to determine a second set temperature profile for each of the plurality of wafers W-3.

However, in the following explanation, a single wafer W-3 is used, for simplicity of explanation.

The first set temperature profile is the set temperature profile that has been determined at S100.

A thickness measuring instrument such as an ellipsometer can be used to measure the thickness of the film. The measurement of the thickness is conducted at a plurality of points on the wafer W-3. As shown in FIG. 8, the measurement points may be for example nine measurement points, which consist of a measurement point A near a center of the wafer, four measurement points F to I near a periphery of the wafer and four measurement points B to E between the center and the periphery of the wafer.

(B) It is judged whether the measured film-thickness distribution within the surface of the wafer is within a predetermined permissible range or not (S206).

FIG. 12(A) is a graph showing an example of measurement result of the film-thickness on the wafer W-3, correspondingly to distances from the center of the wafer W-3.

In FIG. 12(A), the abscissa means the distance from the center of the wafer, and the ordinate means the film-thickness. It is found that the film-thickness is small near the center of the wafer and that the film-thickness is larger toward the periphery of the wafer. Although there is some unevenness depending on the measurement points, in the case of the graph, the film-thickness D on the wafer roughly meets the following expression (35) as a quadratic function of a distance x from the center.

$$D=a\cdot x^2+b \quad (35)$$

where:

a, b: constant

In the expression (35), there is no linear term of the distance x. This is because it is supposed that the film-thickness distribution within the surface is symmetrical with respect to the center of the wafer (the linear term of the distance x is a component asymmetrical with respect to the center of the wafer).

The constants a, b can be calculated for example by using a least squares method. Thus, a theoretical film-thickness d0 on the center of the wafer W-3, a theoretical film-thickness d1 on middle point (between the center and the periphery) and a theoretical film-thickness d2 at the periphery can be calculated, respectively. Then, a ratio of film-thickness distribution Δ similar to the expression (10) can be adopted as a value representing magnitude of the film-thickness distribution within the surface of the wafer.

$$\Delta=|d2-d0|/[(d2+d0)/2] \quad (40)$$

The ratio of film-thickness distribution Δ is compared with a predetermined permissible value in order to judge whether the film-thickness distribution within the surface is within the permissible range or not.

(C) If the judgement of S206 is Yes (if the film-thickness distribution is within the predetermined permissible range), it is unnecessary to amend the first set temperature profile, which may be set as a second set temperature profile.

If the judgement of S206 is No, by using a theoretical value of the thickness-temperature coefficient, temperature distribution within the surface of the wafer necessary to make the film-thickness distribution uniform within the surface of the wafer is calculated (S208).

Factors causing the film-thickness distribution to appear within the surface of the wafer W-3 are divided into the following two ones. However, whatever factors there are, the film-thickness distribution within the surface can be made uniform by controlling the temperature distribution within the surface of the wafer.

①: there is temperature distribution within the surface of the wafer.

②: there is a factor other than the temperature distribution, for example density distribution of the process gas within the surface of the wafer.

Regarding the factor ①, as described below, it is effective to use a change-in-time set temperature.

The factor ② may be more dominant when the process gas is thin for example when a reduced-pressure CVD process or the like is conducted. That is, since the process gas is consumed at the periphery of the wafer, the density of the process gas reaching the center of the wafer is reduced, so that the central film-thickness becomes thinner than the peripheral film-thickness. On the other hand, when the heat process is conducted under a normal pressure for example when a thermal oxidation process is conducted, the density of the process gas changes only a little even if the process gas is consumed. Thus, the factor ② may be less dominant.

It is difficult to remove the factor ②. However, even if there is the factor ②, the film-thickness distribution can be made uniform by controlling the temperature distribution within the surface of the wafer.

For example, FIG. 12(B) is a graph showing an example of the relationship between distances from the center of the wafer and average temperatures of the wafer at the distances.

In FIG. 12(A), the film-thickness on the wafer is larger from the center of the wafer toward the periphery. Thus, correspondingly to that, the average temperatures shown in FIG. 12(B) are reduced from the center of the wafer toward the periphery. That is, the uniformity of the film-thickness distribution on the wafer can be improved by making a temperature distribution on the wafer, which has a reverse tendency to the film-thickness of the graph shown in FIG. 12(A).

Next, a method of calculating a temperature distribution within the surface that is necessary to make the film-thickness distribution within the surface uniform is explained.

At first, with respect to a change-in-time set temperature, it is disclosed that a film-forming rate is determined by an average in time of the temperature (average temperature) during the film-forming process. That is, the temperature distribution within the surface by the change-in-time set temperature can be represented based on average temperatures at respective positions on the surface of the substrate.

In the change-in-time set temperature, temperature changes as time passes. Thus, the final film-thickness can be obtained by integrating the growing rate of the film by time. However, an average of the growing rate of the film is determined by the average of the temperature. This is disclosed as follows.

The film-thickness D of the film formed on the wafer is represented by the following expression (50) by using a film forming rate (a growing rate of the film) V and time t.

$$D = \int_{ts}^{te} V(T) dt \quad (50)$$

where:

∫: integrating symbol ts: starting time of the film-forming step te: ending time of the film-forming step V(T): a film-forming rate V (a function of the temperature T)

The film-forming rate V(T) can be developed by a constant term of the temperature T0 into the following expression (51).

$$V(T) = V(T0) + V1(T0) \times (T - T0) \quad (51)$$

where:

V1(T0): dV(T0)/dt (differentiation by time of the film-forming rate V)

The following expression (52) can be obtained by substituting (assigning) the expression (51) for the expression (50).

$$D = V(T0) \times (te - ts) + V1(T0) \times \int_{ts}^{te} (T - T0) dt \quad (52)$$

Herein, an average in time of the temperature T (average temperature) T(Av) is defined by the following expression (53).

$$T(Av) = \int_{ts}^{te} T(t) dt / (te - ts) \quad (53)$$

Suppose T0=T(Av) in the expression (53), the following expression (54) can be obtained.

$$D/(te - ts) = V(T(Av)) \quad (54)$$

where:

D/(te−ts): an average of the film-forming rate during the film-forming step (average film-forming rate)

That is, the expression (54) means that the average film-forming rate when the temperature changes during the film-forming step is determined by the average temperature T(Av).

As seen from the above explanation, the film-thickness distribution within the surface of the wafer can be made uniform by controlling an average in time of a central temperature (average central temperature) Tc (Av) and an average in time of a peripheral temperature (average peripheral temperature) Te(Av) during the film-forming step. The average central temperature Tc(Av) and the average peripheral temperature Te(Av) are represented by the following expressions.

$$Tc(Av) = \int_{ts}^{te} Tc(t) dt / (te - ts) \quad (55)$$

$$Te(Av) = \int_{ts}^{te} Te(t) dt / (te - ts) \quad (56)$$

The average central temperature of the wafer W-3 is represented by Tc1, the average peripheral temperature thereof Te1, the central film-thickness Dc1, the peripheral film-thicnkess De1, the target film-thickness of the wafer W-3 Dt, an average central temperature at that time Tc2 and an average peripheral temperature at that time Te2. Then, a target temperature difference within the surface ΔT2 (=Te2−Tc2) can be calculated as follows.

A thickness-temperature coefficient Sc at the center of the wafer and a thickness-temperature coefficient Se at the periphery of the wafer may be represented by the following expressions (57) and (58).

$$Sc = (Dt - Dc1) / [Dc1 \cdot (Tc2 - Tc1)] \quad (57)$$

$$Se = (Dt - De1) / [De1 \cdot (Te2 - Te1)] \quad (58)$$

Suppose Sc=Se=S and $$Dt = 2 \cdot Dc1 \cdot De1 \cdot (Dc1 + De1) \quad (59),$$

$$Tc2 - Tc1 = -(Te2 - Te1) \quad (60)$$

can be obtained.

By substituting (assigning) the expressions (59) and (60) into the expression (57) and using ΔT1=Te1−Tc1: an average temperature difference within the surface of the wafer W-3 and ΔT2=Te2−Tc2: a target average temperature difference within the surface, the following expression (61) can be obtained.

$$\Delta T2 = \Delta T1 + 2(Dc1 - De1) / [(Tc1 + Te1) \cdot S] \quad (61)$$

A theoretical value of the thickness-temperature coefficient S is represented by the following expression (62) from the expression (21).

$$S = (Ea/(k \cdot T^2))[1/°C.] \quad (62)$$

Ea, k, the film thickness Dc1 and De1 are known, so that the target average temperature difference within the surface ΔT2 can be calculated by the expressions (61) and (62) by substituting the average in time Tsp1(Av) of the set temperature Tsp1 of the wafer W-3 for the absolute temperature T.

(D) A gradient in time of the change-in-time set temperature is calculated based on the calculated temperature difference within the surface ΔT (S210). Then, the first set temperature profile is amended based on the gradient in time.

At first, it is disclosed that the temperature distribution within the surface of the wafer can be controlled by using the change-in-time set temperature.

Figure 13:
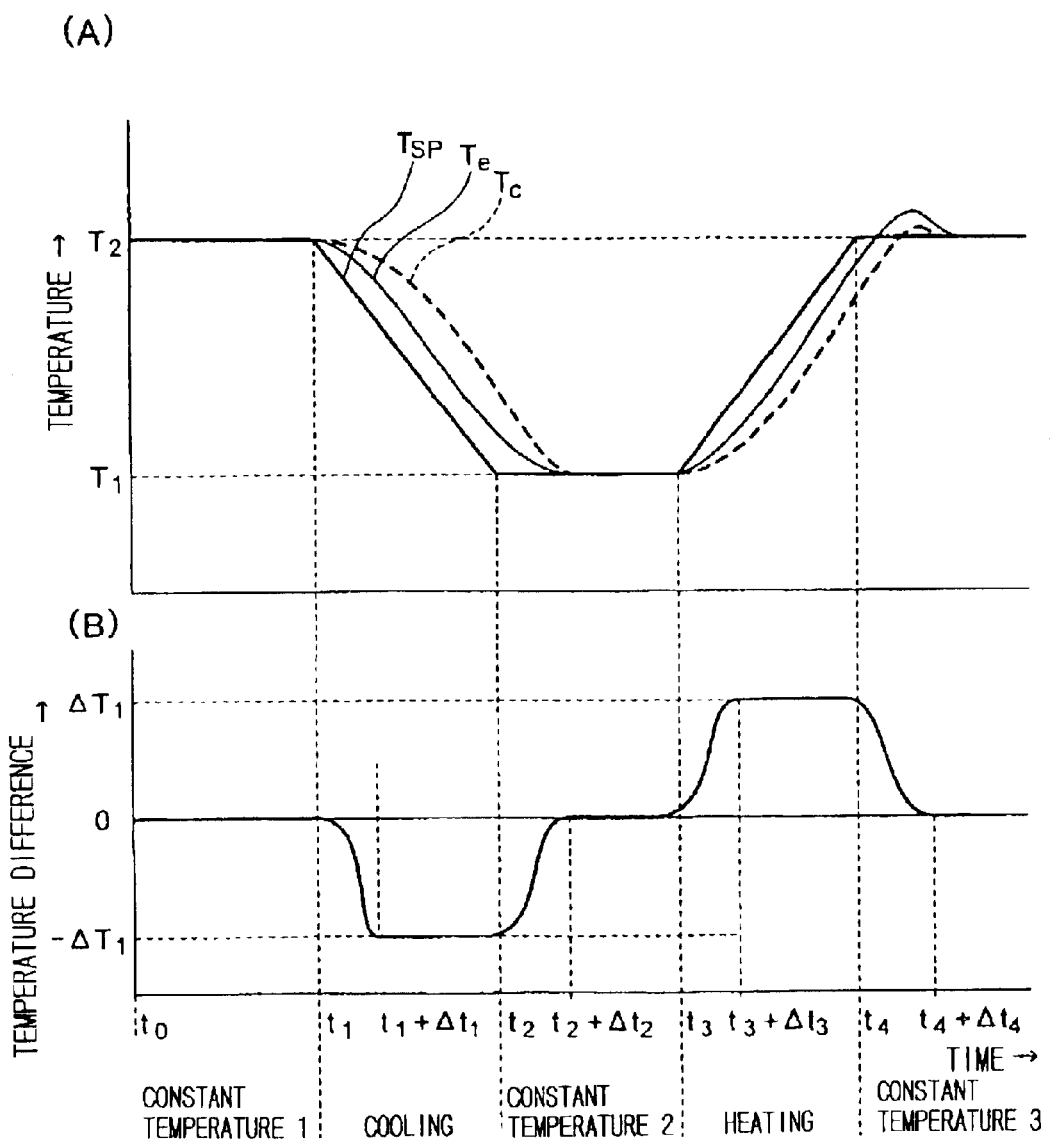
FIG. 13 are graphs showing an example of changes in time of a set temperature Tsp, a central temperature Tc, a peripheral temperature Te and a temperature difference within a surface ΔT.

FIG. 13(A) is a graph showing changes in time of a set temperature Tsp, a central temperature Tc near the center of a wafer and a peripheral temperature Te near the periphery of the wafer. FIG. 13(B) is a graph showing a change in time of a temperature difference within the surface ΔT (=Te−Tc) of the wafer.

These graphs can be divided into a constant-temperature step from a time t0 to a time t1, a cooling step from the time t1 to a time t2, a constant-temperature step from the time t2 to a time t3, a heating step from the time t3 to a time t4 and a constant-temperature step after the time t4.

In the heating step and the cooling step, a temperature difference within the surface ΔT is generated. The temperature difference is reverse between the heating step and the cooling step. That is, positive and negative of the gradient in the change-in-time set temperature correspond to (coincide with) positive and negative of the temperature difference within the surface.

The relationship between the temperature gradient and the temperature difference within the surface is formed since the peripheries of the layered wafers W are facing the heaters 31 to 35. That is, the peripheries of the wafers are easier to be heated and easier to radiate heat, than the centers of the wafers.

Thus, when the temperature is lowered, the central temperature becomes higher than the peripheral temperature so that the temperature difference ΔT is generated. On the contrary, when the temperature is raised, the peripheral temperature becomes higher than the central temperature so that the temperature difference ΔT is generated. In addition, it is found that these temperature difference ΔT has substantially the same absolute value ΔT1 during the respective steps although there are some delays in time on shifting to the constant-steps, the cooling step, the heating step or the like.

Figure 14:
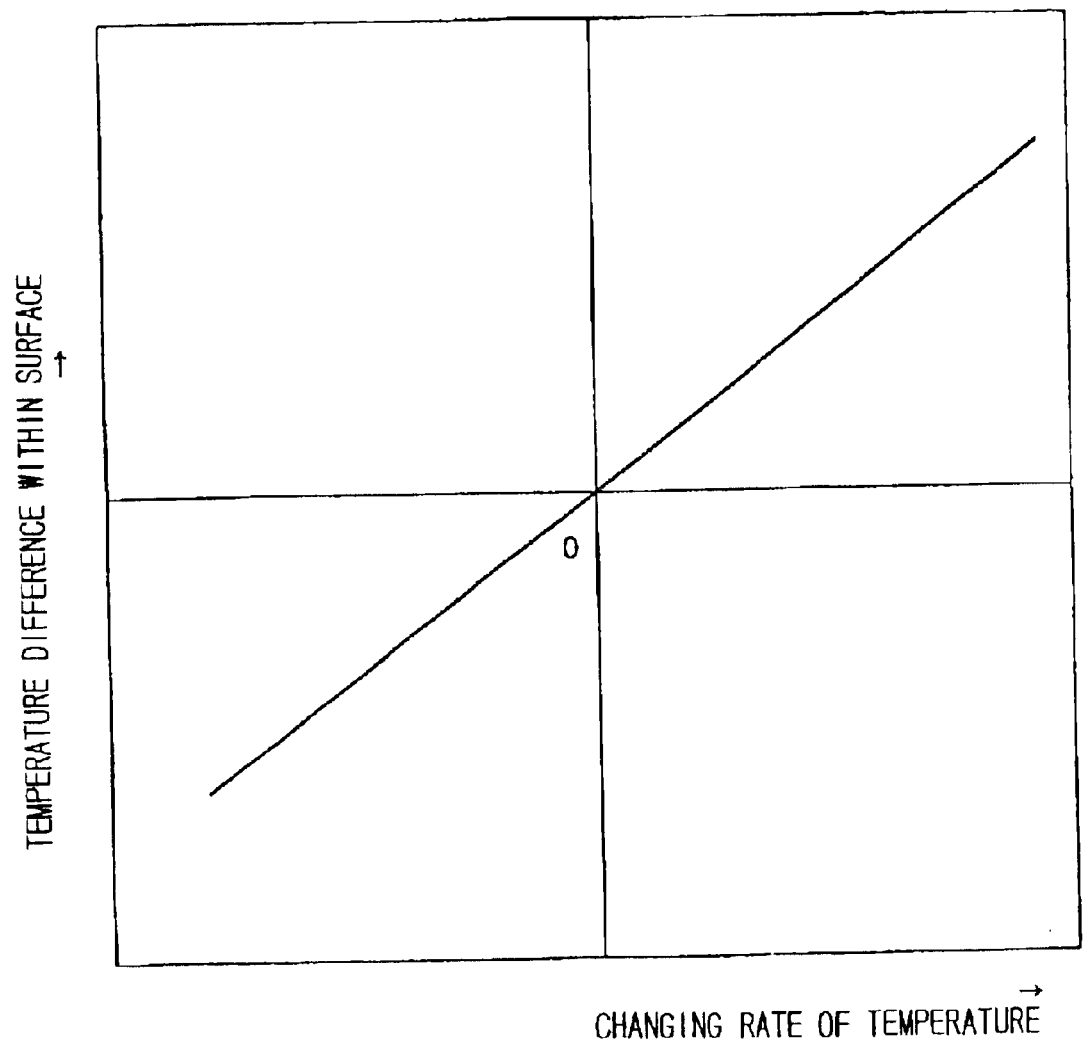
FIG. 14 is a graph showing a relationship between a change rate (gradient) of a set temperature and a temperature difference within a surface ΔT.

FIG. 14 is a graph showing a relationship between change rates (=dTsp/dt) of a set temperature and temperature differences within a surface ΔT (=Te−Tc). From FIG. 14, it can be seen that the change rate of a set temperature (a gradient in time of a set temperature) is proportional to the temperature difference within a surface. A concrete relationship (a constant of proportionality) between the change rate of a set temperature V and the temperature difference within a surface ΔT is different dependently on each heat processing furnace. However, the proportional constant can be obtained experimentally. For example, if a wafer W is heated at a predetermined heating rate (or cooled at a predetermined cooling rate) and a temperature difference within a surface ΔT at that time is measured, the proportional constant can be obtained.

As seen from the above explanation, magnitude and positive or negative of the temperature distribution (the temperature difference within the surface ΔT) can be controlled by changing the gradient of the change-in-time set temperature.

As described above, a necessary gradient of the change-in-time set temperature dTsp/dt can be calculated from the calculated necessary temperature difference within the surface ΔT2, by using the relationship between the gradient of the change-in-time set temperature dTsp/dt and the temperature difference within the surface ΔT, for example the relationship shown in FIG. 14.

Then, the first set temperature profile is amended based on the calculated gradient of the change-in-time set temperature. This example is shown in FIG. 15.

Figure 15:
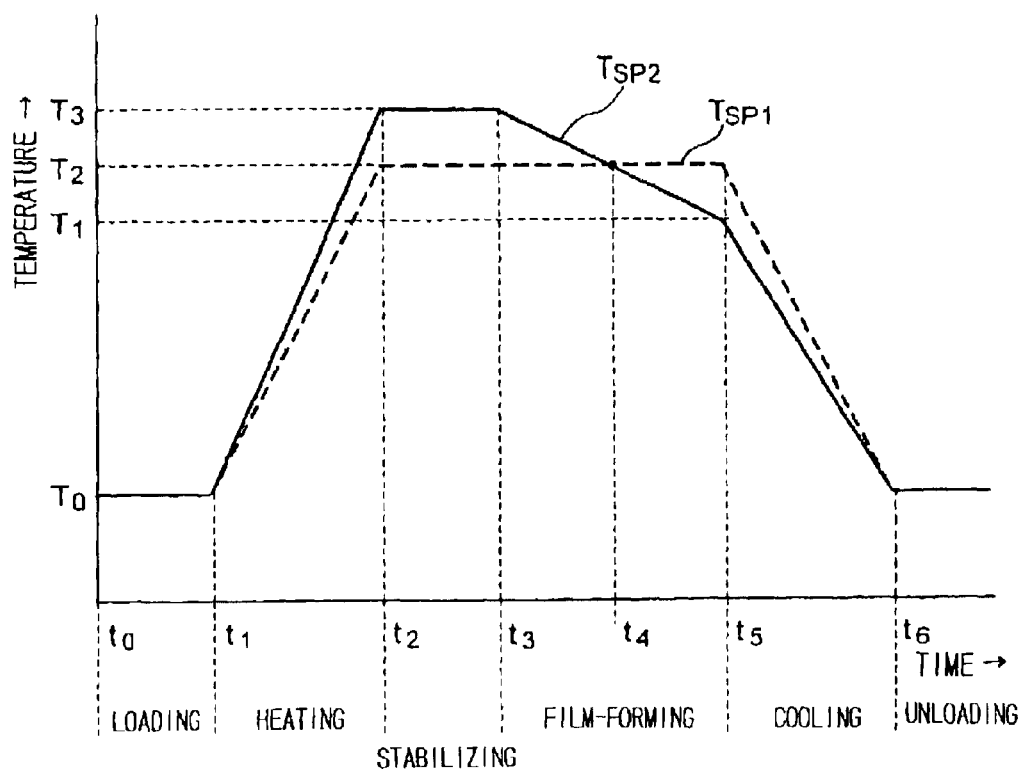
FIG. 15 is a graph showing an amended first set temperature profile Tsp2 in comparison with a set temperature profile Tsp1 before amended.

FIG. 15 is a graph showing an amended first set temperature profile Tsp2 in comparison with a first set temperature profile Tsp1 before amended. The set temperature during the film forming step is a constant one in the profile before amended, but a change-in-time one in the amended profile.

Herein, an average value of the set temperature during the film-forming step is the same temperature T2 before and after the amendment. This is because an average of the film-thickness on the wafer may not be caused to change (as shown in the expression (54), the average in time of the growing rate of the film is determined by the average in time of the temperature).

When the first set temperature profile is amended, it is important how to define the set temperature during the film-forming step. On the contrary, conditions before and after the film-forming step may be some different without any problems. For example, the heating rate in the heating step from the time t1 to the time t2, the heating time and/or the stabilization time (t3−t2) may be some different between before and after the amendment of the set temperature profile without any problems.

(E) In accordance with the amended first set temperature profile, wafers W-4 of a fourth batch undergo a heat process (S212). Then, film-thickness distribution on each of the wafers W-4 is measured (S214). Then, it is judged whether the measured film-thickness distribution within each surface of the wafers W-4 is within a predetermined permissible range or not (S216).

Figure 16:
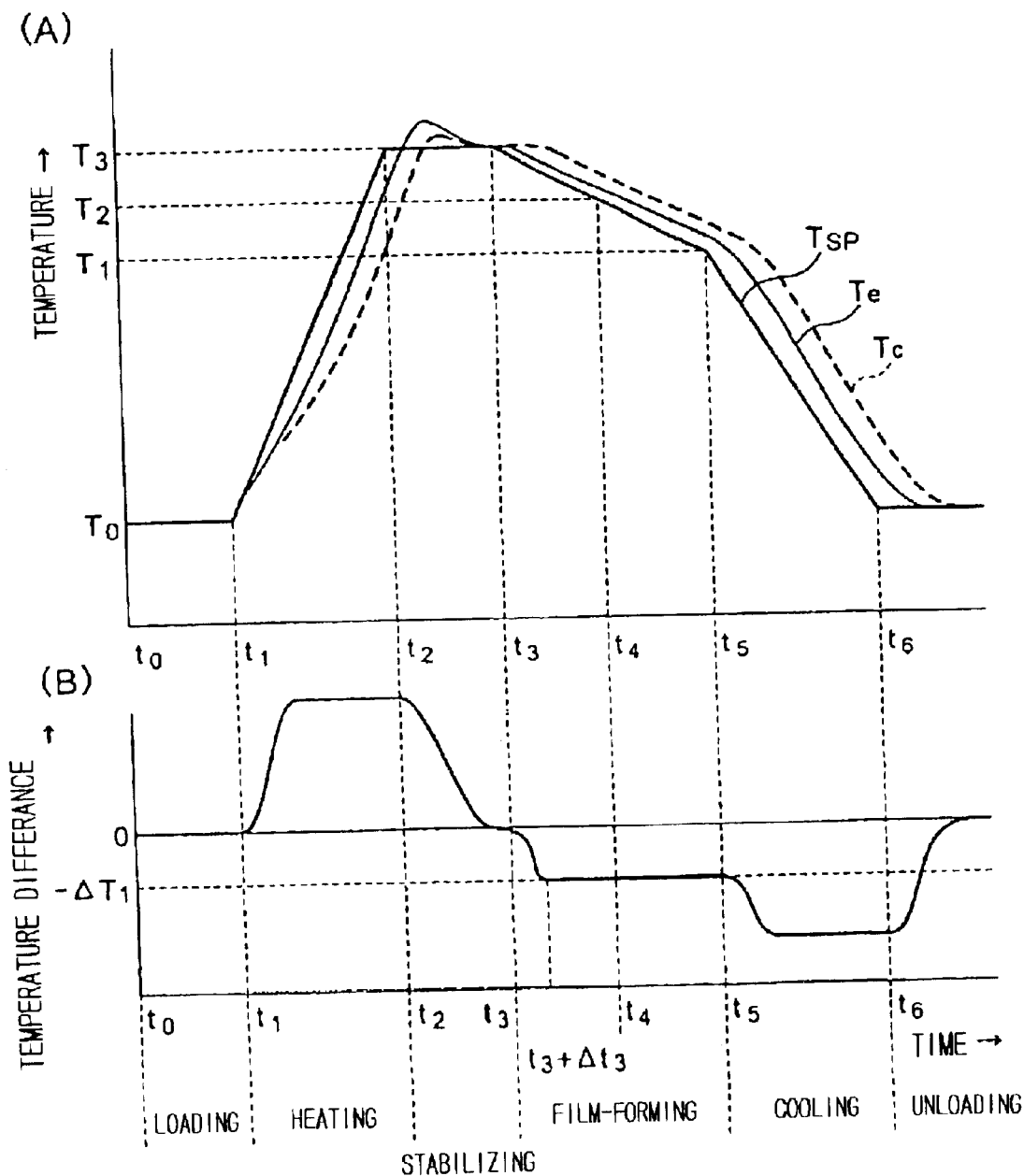
FIG. 16 are graphs showing an example of changes in time of a set temperature, a central temperature Tc, a peripheral temperature Te and a temperature difference ΔT, based on the amended first set temperature profile Tsp2.

FIG. 16 shows changes in time of temperatures when a heat process is conducted in accordance with the set temperature profile shown in FIG. 15. FIG. 16(A) is a graph showing changes in time of a set temperature, a central temperature Tc near the center of the wafer and a peripheral temperature Te near the periphery of the wafer, FIG. 16(B) is a graph showing a change in time of a temperature difference ΔT (=Te−Tc), respectively.

As shown in FIGS. 16(A) and 16(B), with respect to the wafer W-4 during the film-forming step (during the heat processing step), the central temperature Tc near the center of the wafer is higher than the peripheral temperature Te near the periphery of the wafer. This is caused by that the change-in-time set temperature has a gradient, as described above. Thus, if a temperature distribution reverse to the film-thickness distribution measured at S204 is given (wherein the central temperature is set to be higher than the peripheral temperature for the wafer W-4 when the film-thickness at the periphery is larger than at the center in the wafer W-3), the film-thickness distribution within the surface of the wafer W-4 can be made uniform.

Figure 17:
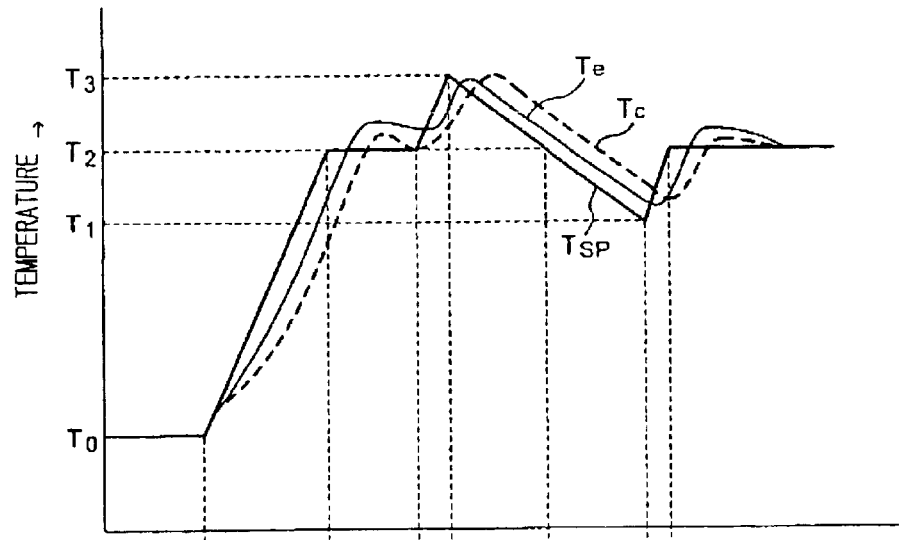
FIG. 17 are graphs showing an example of changes in time of a set temperature, a central temperature Tc, a peripheral temperature Te and a temperature difference ΔT, based on another amended first set temperature profile Tsp2.
Figure 17:
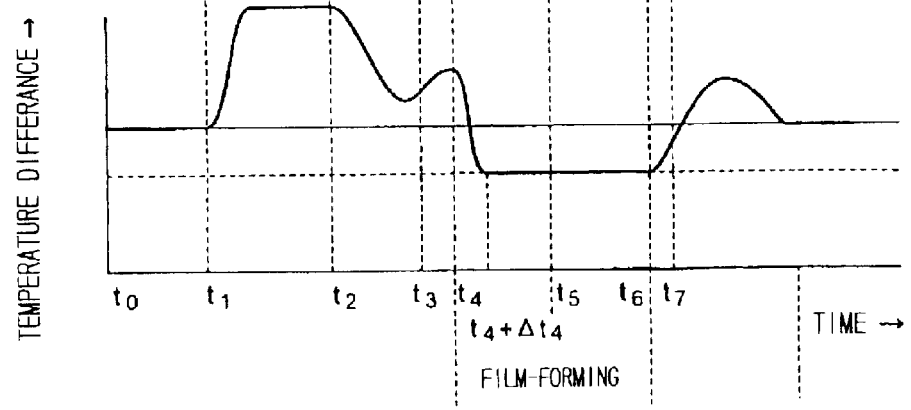

Next, another example of amendment to the first set temperature profile, which is different from that shown in FIG. 15, is explained. FIG. 17 shows a set temperature profile wherein steps before and after the film-forming step are changed when the first set temperature profile is amended.

FIG. 17(A) is a graph showing changes in time of a set temperature, a central temperature Tc near the center of the wafer and a peripheral temperature Te near the periphery of the wafer, FIG. 17(B) is a graph showing a change in time of a temperature difference ΔT (=Te−Tc), respectively.

In the case of FIG. 17(A), there are heating steps (from a time t3 to a time t4 and from a time t6 and a time t7) both before and after the film-forming step (from the time t4 to the time t6). In addition, there is a second stabilization step after the time t7. Herein, the set temperature during the first stabilization step (from the time t2 to the time t3), the set temperature during the second stabilization step (after the time t7) and an average of the set temperature during the film-forming step (from the time t4 to the time t6) coincide with T2, respectively. Thus, if a standard set temperature (in the case, T2) is defined, the heat processing step can be also clearly defined. For example, respective heat processing steps can be easily distinguished from each other if the standard set temperature is differently set for each of the series of heat processing steps.

Thus, if the film-forming step is not greatly influenced, it can be adopted to add some steps before and after the film-forming step when the first set temperature profile is amended.

(F) If the judgement at S216 is Yes, the amended first set temperature profile is determined as a second set temperature profile, and the determining step of the second set temperature profile is completed.

Herein, in the case of FIG. 16(A), the change in time of the set temperature starts at a starting point of the film-forming step (t3). Thus, as shown in FIG. 16(B), a transitional state is generated in the temperature distribution for an initial term of the film-forming step (from the time t3 to a time t3+Δt3). Thus, in order to achieve uniform growth of the film during the film-forming term, it is preferable to delay the starting time of the substantial film-forming process such as introduction of a process gas a little from the starting point of the change in time of the set temperature.

(G) If the judgement of S216 is No, a thickness-temperature coefficient S is calculated based on a measurement result about the film-thickness on the wafers W-3 of the third batch and the film-thickness on the wafers W-4 of the fourth batch (S218).

The calculation may be conducted by using the expression (30). Herein, for the temperatures T1 and T2, the average in time of the temperature during the film-forming step T(Av) is used.

(H) Then, a temperature distribution within the surface of the wafer necessary to make the film-thickness distribution within the surface of the wafer uniform is calculated based on the calculated value of the thickness-temperature coefficient (S220). Then, a gradient of the change-in-time set temperature is calculated based on the temperature distribution, and a further amendment is made to the previously amended first set temperature profile.

These steps substantially correspond to the steps S208 and S210. Thus, explanation to be overlapped is omitted.

(I) Then, the steps S212 to S222 are repeated until the film-thickness distribution within the surface of the wafer becomes within the permissible range. Thus, finally, the second set temperature profile is determined.

(Detail of the Determining Step of the Third Set Temperature Profile)

Next, the detail of the determining step of the third set temperature profile at S300 is explained. The determining step of the third set temperature profile is conducted to improve deterioration in the film-thickness distribution between the plurality of groups of the substrates, which may be caused by the determining step of the second set temperature profile (amending step of the first set temperature profile). That is, the object to determine the third set temperature profile is the same as the object to determine the first set temperature profile. The basic difference between them is in a point that the set temperature during the film forming step is a constant one in the first set temperature profile, but a change-in-time one in the third set temperature profile.

Figure 18:
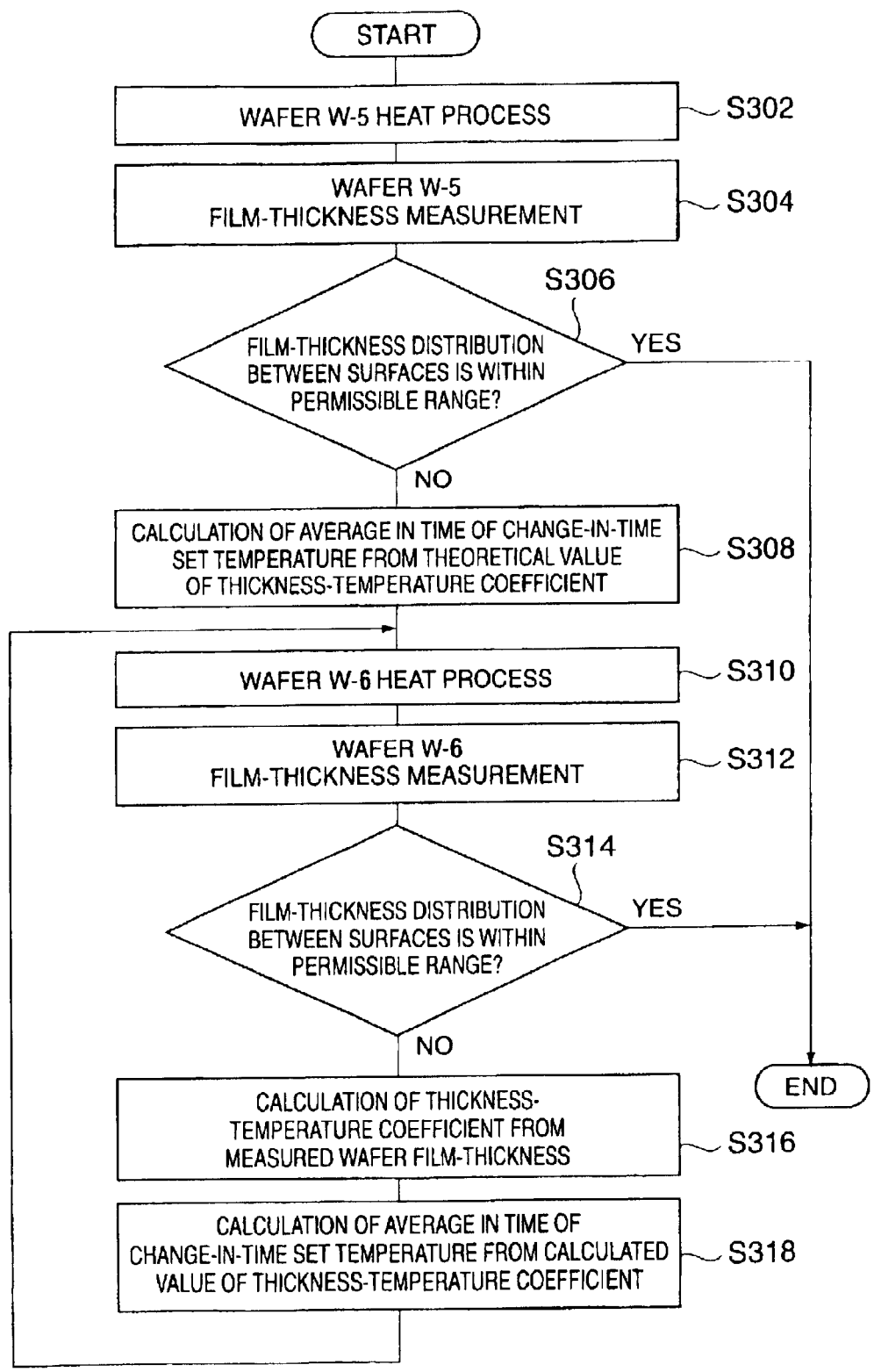
FIG. 18 is a flow chart showing detail of a determining procedure of a third set temperature profile.

FIG. 18 is a flow chart showing the detail of the determining procedure of the third set temperature profile.

As shown in FIG. 18, the determining step of the third set temperature profile corresponds to the determining step of the first set temperature profile shown in FIG. 7. In the determining step of the first set temperature profile, the constant set temperature is used for the calculating processes such as S108 and S116. However, differently from that, in the determining step of the third set temperature profile, an average in time of the change-in-time set temperature is used for the calculating processes such as S308 and S316.

FIG. 19 shows an example of a second set temperature profile amended in accordance with the flow shown in FIG. 18 (that is, an example of a third set temperature profile). Herein, the second set temperature profile shown in FIG. 17 is amended.

Figure 19A:
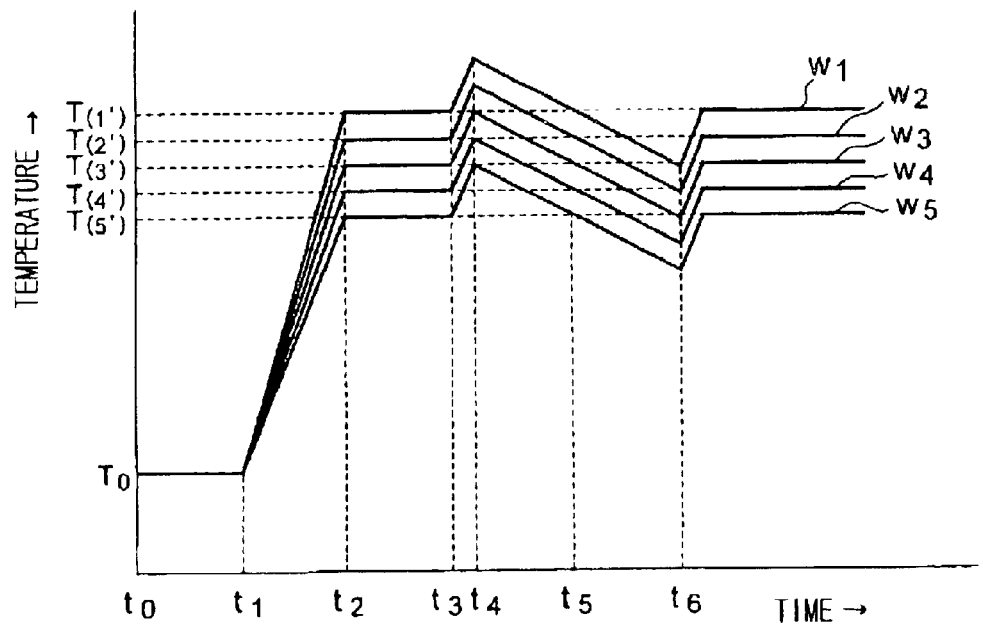
FIG. 19 is a graph showing an example of correspondence between amended second set temperature profiles and averages of change-in-time set temperatures during the deposition and positions of monitor wafers W1 to W5.
Figure 19B:
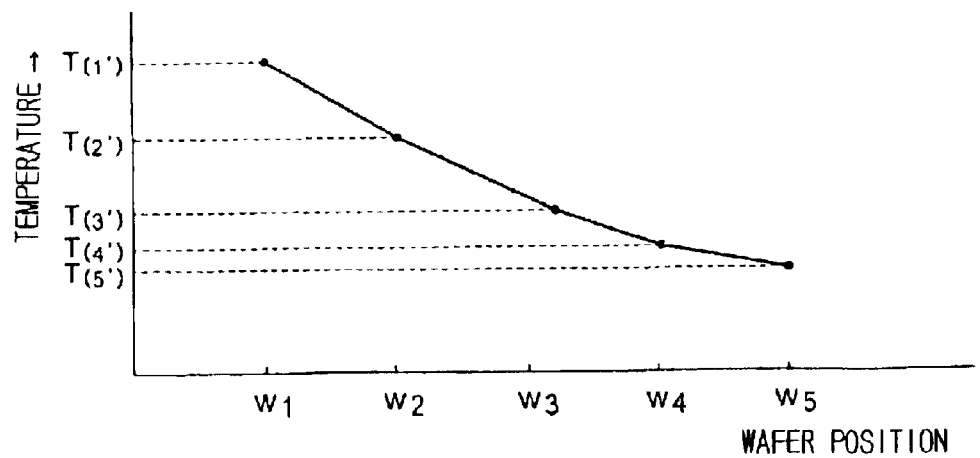

Set temperature profiles for the respective substrates in the groups G1 to G5 (for the monitor wafers W1 to W5) is shown in FIG. 19(A). Averages of change-in-time set temperatures during the film-forming step are shown correspondingly to positions of the monitor wafers W1 to W5 in FIG. 19(B). FIG. 19 corresponds to FIG. 10 that shows the first set temperature profile.

In the case of FIG. 19, in the determining step of the second set temperature profile, only one gradient is defined for the change-in-time set temperatures. Thus, the change-in-time set temperatures for the groups G1 to G5 of the substrates (the monitor wafers W1 to W5) arranged in the zones 1 to 5 of the vertical heat processing furnace 10 are different from each other only in their constant terms (offsets) during the film-forming step (that is, the shapes of the change-in-time set temperatures are the same).

However, the shapes of the change-in-time set temperatures may be different between the groups of the substrates G1 to G5 (the monitor wafers W1 to W5). In that case too, the shape of the change-in-time set temperature for each of the groups G1 to G5 (the monitor wafers W1 to W5) is the same between before and after the amendment. In short, for each of the groups of the substrates G1 to G5 (the monitor wafers Wi to W5), it is sufficient to conduct a calculation of a proper average in time of the change-in-time set temperature and an amendment of the set temperature profile based on the calculation, in such a manner that an average of the film-thickness on the wafers becomes closer to the target film-thickness Dt.

In addition, as already described above, the set temperature profile may be changed somewhat before and after the film-forming step (from the time t4 to the time t6). In addition, it is preferable that the substantial film-forming process such as the introduction of the process gas starts after the change in time of the set temperature has started and further a short time has passed.

Regarding other points, essentially, this step is not different from the determining step of the first set temperature profile shown in FIG. 7. Thus, explanation to be overlapped is omitted.

(Other Embodiments)

The above embodiments may be expanded or modified within a scope of technical conception of the invention.

At first, regarding the determining steps of the first, second and third set temperature profiles, it is unnecessary to combine the three steps. Each of them can be conducted solely without any problems. For the determining steps of the first and third set temperature profiles, there is a precondition in that the substrates are divided into a plurality of groups. However, for the determining step of the second set temperature profile, the substrates may form only one group.

The substrate is not limited to the semiconductor wafer, but may be for example a glass substrate.

The gradient of the change-in-time set temperature may be not necessarily constant in time. Even if the gradient is not constant, the film-thickness distribution within the surface of the substrate can be made uniform.

The number of divided segments of the heater is not limited to five. In addition, in order to control the heater, the representative temperature Tr does not have to be calculated always from the central temperature Tc and the peripheral temperature Te. Any other temperature somehow representing the substrate may be appropriately used.

The central temperatures T1 and the peripheral temperatures T5 may be directly measured instead of being estimated from the measurement signals of the temperature sensors $S_{in}$ and $S_{out}$. For example, (a) a method of arranging temperature sensors such as thermocouples on the monitor wafers W1 to W5 or (b) a non-contact measuring method using radiation pyrometers or the like may be utilized. In the case, the measurement signals of the temperature sensors $S_{in}$ and $S_{out}$ are not used.

Next, another embodiment of the present invention will be described with reference to the accompanying drawings.

Figure 20:
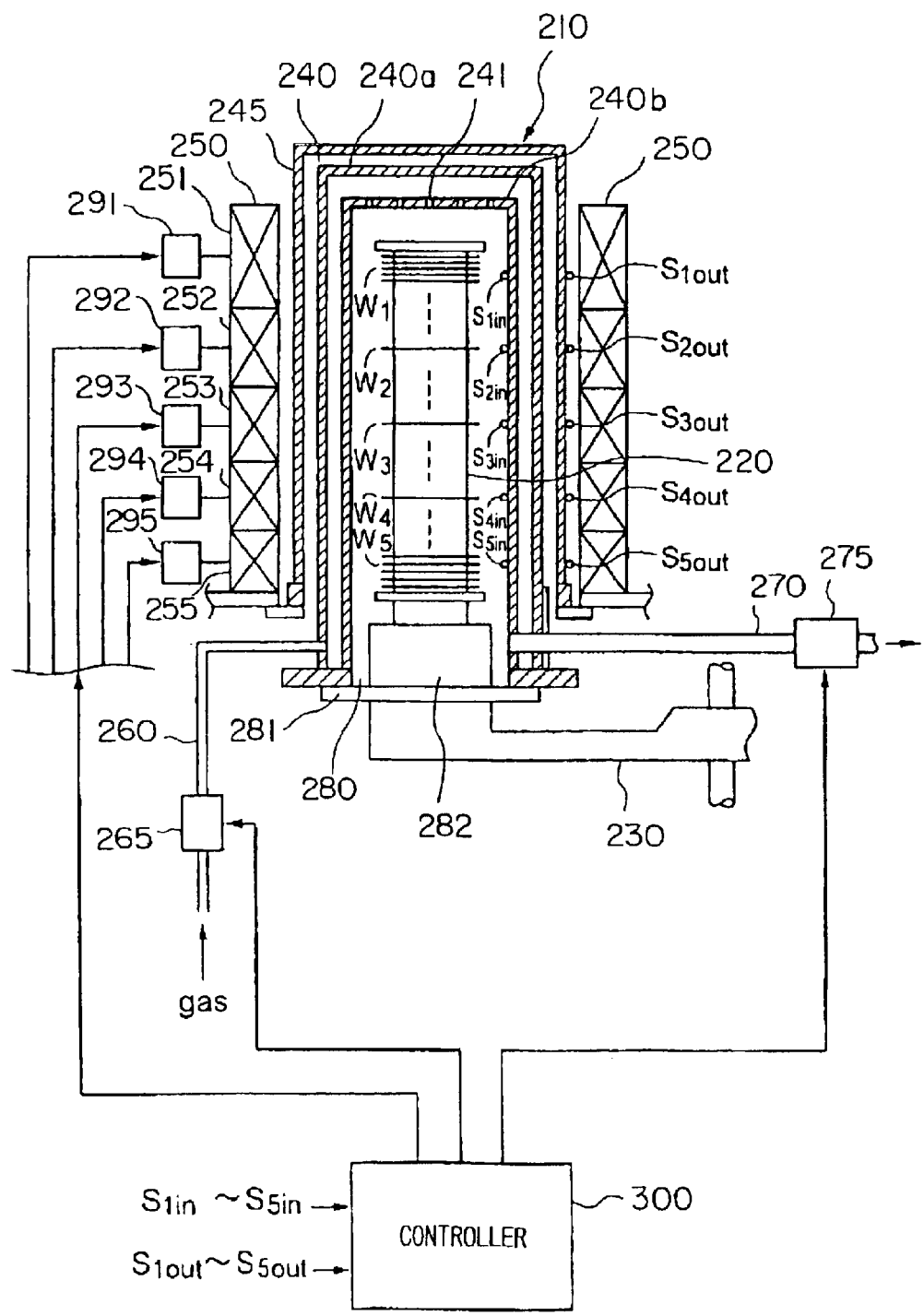
FIG. 20 is a schematic sectional view of an embodiment of a vertical thermal processing system according to the present invention.
Figure 21:
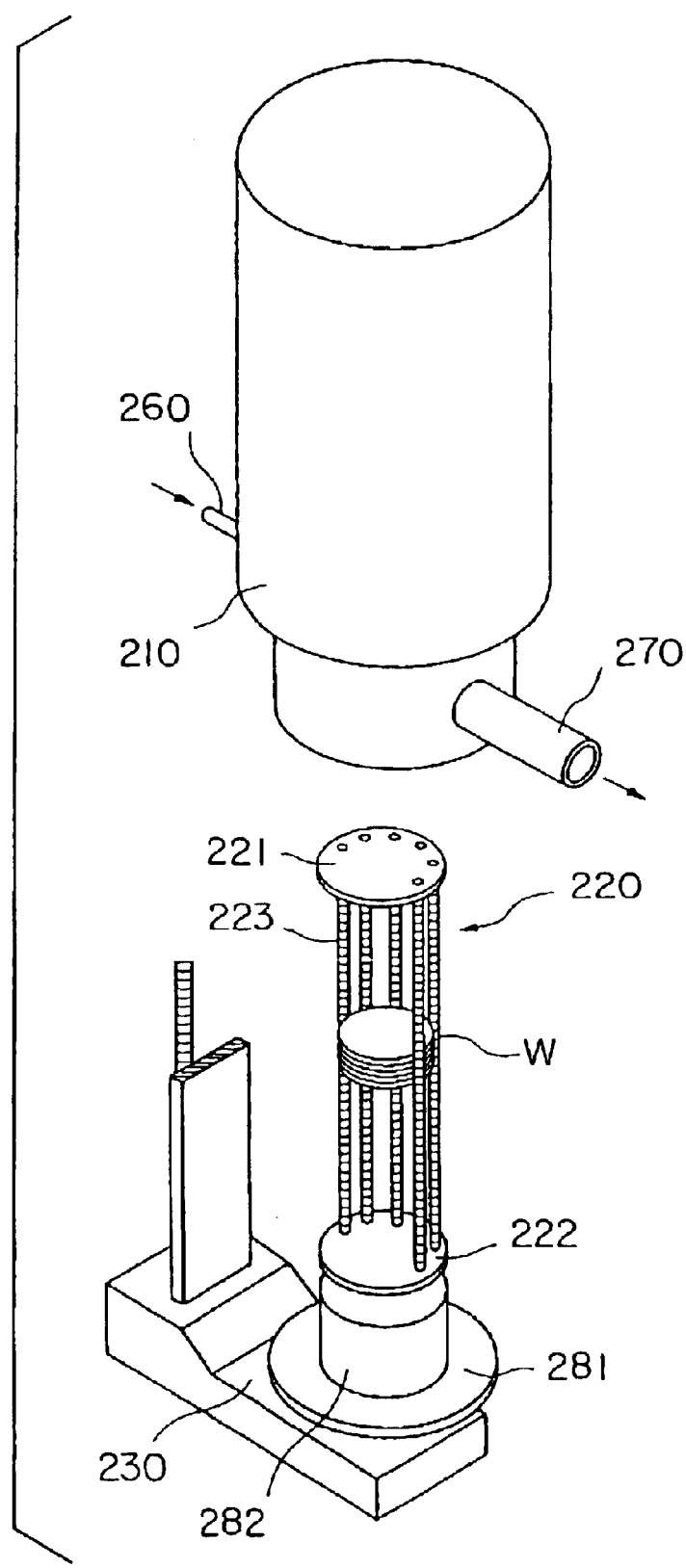
FIG. 21 is a schematic perspective view of the embodiment of the vertical thermal processing system according to the present invention.

FIGS. 20 and 21 are a schematic sectional view and a schematic perspective view, respectively, of a vertical thermal processing system in the embodiment according to the present invention.

As shown in FIG. 20, the vertical thermal processing system of the embodiment is provided with a vertical thermal processing furnace 210, a wafer boat 220 as a wafer holder, a boat elevator 230 that causes the wafer boat 220 to vertically move and a controller 300.

The vertical thermal processing furnace 210 has a double-wall reaction tube 240, for example made of quartz, and a heater 250, for example consisting of resistance-heating elements provided so as to surround the reaction tube 240.

A gas supply pipe 260 and a discharge pipe 270 are connected to a base portion of the reaction tube 240. Thus, a gas is adapted to flow from an outer tube 240a of the reaction tube 240 into an inner tube 240b via gas holes 241. A flow rate of the gas in the gas supply pipe 260 is controlled by a flow-rate controller 265. A discharge rate of the gas from the discharge pipe 270 is controlled by a discharge-rate controller 275. In addition, 245 represents a soaking container.

For example, the wafer boat 220 is provided with a plurality of pillars 223 between a ceiling plate 221 and a base plate 222. Many horizontal grooves for holding peripheries of wafers (objects to be processed) W are formed in the respective pillars 223 at vertical intervals. Thus, the wafers W can be held in a tier-like manner. The wafer boat 220 is placed on a heat insulating tube 282 provided on a cover 281 that can open and close an opening 280 at a lower end of the vertical thermal processing furnace 210. The cover 281 is provided on the boat elevator 230. When the boat elevator 230 moves vertically, the wafer boat 220 can be transferred into and out from the vertical thermal processing furnace 210.

The heater 250 is divided into five heating segments 251 to 255. The respective heating segments 251 to 255 are adapted to mainly heat respective zones 201 to 205 in the vertical heat processing furnace 210. Monitor wafers W1 to W5 for monitoring temperature are arranged at positions that respectively represent the zones 201 to 205. That is, the monitor wafers W1 to W5 and the zones 201 to 205 correspond to each other in a one-to-one manner. Consumption of electricity of the respective heating segments 251 to 255 is individually controlled by respective power controllers 291 to 295.

Temperatures of the monitor wafers W1 to W5 are not directly measured, but estimated based on a temperature measurement result by temperature sensors Sout and Sin, which are respectively arranged near the heater 250 (on the outside wall of the container for soaking 245) and near the wafers W (on the inside wall of the inner tube 240b). In the case, it is unnecessary to bring the wafers into contact with temperature sensors such as thermocouples, so that it can be prevented that the wafers are contaminated by metal or the like. Regarding the temperature sensors Sin and Sout, respectively, a plurality of temperature sensors Sin1 to Sin5 and Sout1 to Sout5 are arranged correspondingly to the respective monitor wafers W1 to W5.

The controller 300 is adapted to control the vertical thermal processing furnace 210. Measurement signals of the temperature sensors Sin1 to Sin5 and Sout1 to Sout5 are inputted to the controller 300. The controller 300 outputs control signals to the power controller 291 to 295, the flow controller 265 and the discharge controller 275.

Figure 22:
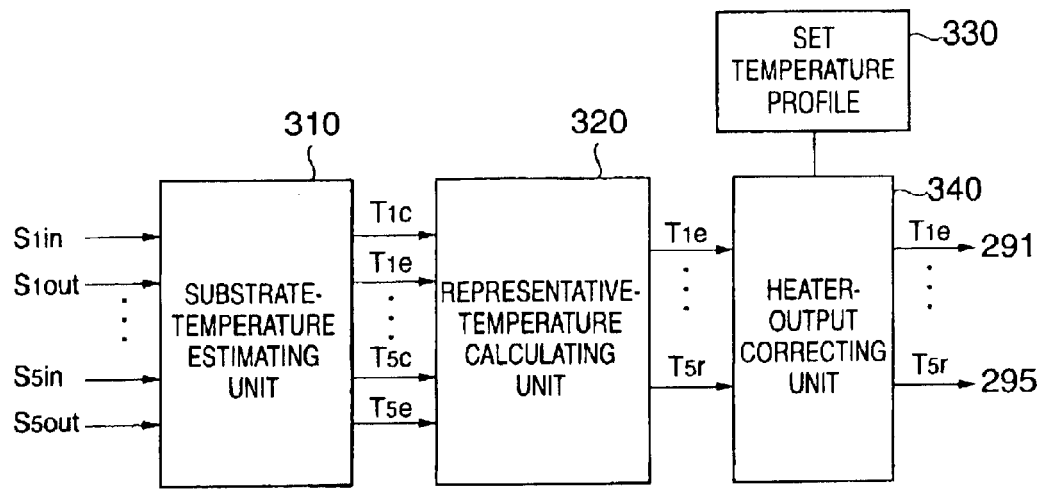
FIG. 22 is a block diagram showing detail of a controller included in the vertical thermal processing system in the embodiment shown in FIGS. 20 and 21.

FIG. 22 is a block diagram showing detail of a part relating to a control of the heater 203, included in the controller 300.

As shown in FIG. 22, the controller 300 includes: a substrate temperature estimating unit 310 that outputs central temperatures T1c to T5c near respective central portions of the monitor wafers W1 to W5 and peripheral temperatures T1e to T5e near respective peripheral portions of the monitor wafers W1 to W5 which are estimated based on the measurement signals provided by the temperature sensors $S1_{in}$ to $S5_{in}$ and $S1_{out}$ to $S5_{out}$; a representative temperature calculating unit 320 that calculates respective representative temperatures T1 to T5 of the monitor wafers W1 to W5 from the central temperatures T1c to T5c and the peripheral temperatures T1e to T5e of the monitor wafers W1 to W5; and a heater output determining unit 340 that determines heater outputs h1 to h5 based on the representative temperatures T1 to T5 of the monitor wafers W1 to W5 and set temperature profiles stored in a set-temperature-profile storage unit 330. The heater outputs h1 to h5 determined by the heater output determining unit 340 are transferred to the power controllers 391 to 395 as the control signals.

The set-temperature-profile storage unit 330 may be any known recording medium such as a hard-disk unit or a floppy-disk unit.

The set temperature profile represents a relationship between a passage of time and a set temperature (a temperature at which the wafer W should be). An example of the set temperature profile is shown in FIG. 23.

Figure 23:
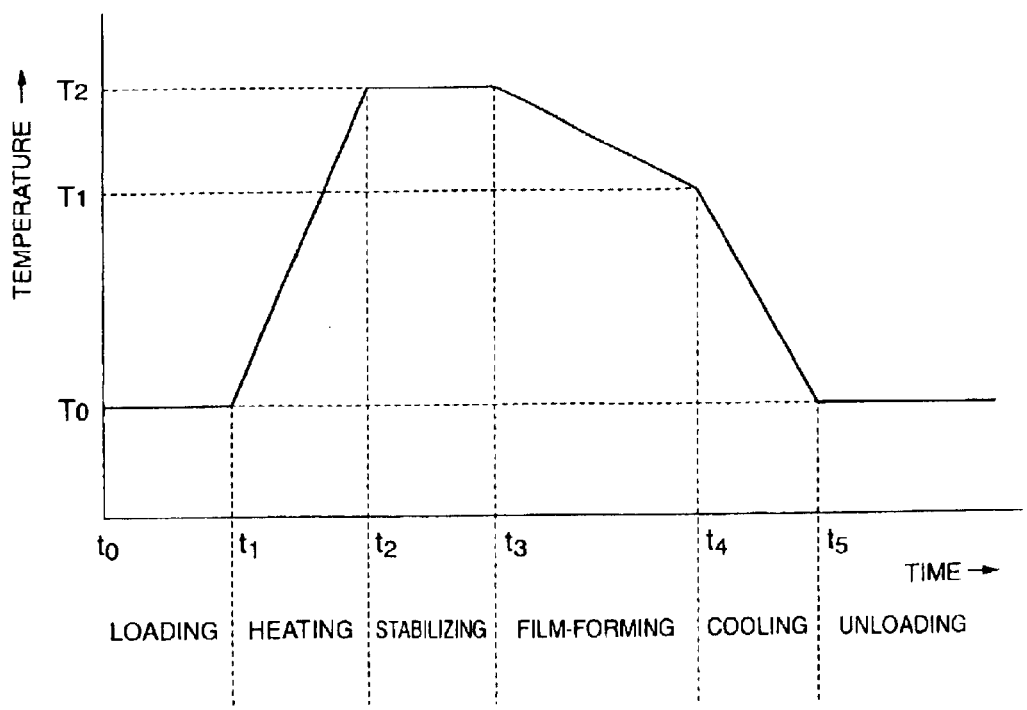
FIG. 23 is a graph showing an example of a set temperature profile for the vertical thermal processing system in the embodiment shown in FIGS. 20 and 21.

FIG. 23 is a graph showing the set temperature profile of the embodiment. As shown in FIG. 23, in the set temperature profile;

(A) From a time t0 to a time t1, the set temperature is maintained at T0. At that time, the wafer boat 220 holding the wafers W is transferred into the vertical heat-processing furnace 210 (loading step).

(B) From the time t1 to a time t2, the set temperature is raised from T0 to T2 at a constant rate (heating step).

(C) From the time t2 to a time t3, the set temperature is maintained at T1. With respect to actual temperatures of the wafers W, because of thermal inertia, it may take some time until the temperatures become constant after the set temperature has been made constant. Thus, until the wafer temperatures are stabilized, the subsequent step is waited (stabilizing step).

In general, the stabilizing step needs several minutes or more, sometimes several decade minutes.

The embodiment has a feature that it is hard for quality of the wafers W to be deteriorated even if the stabilizing time (t3–t2) is shortened or omitted.

(D) From the time t3 to time a t4, the set temperature is gradually lowered from T2 to T1. At that time, a process gas such as oxygen gas is introduced from the gas supply pipe 260 into the vertical heat-processing furnace 210 and a heat process such as a film-forming process of an oxide film onto a silicon wafer is conducted (film-forming step).

That is, the set temperature during the film-forming step is a change-in-time set temperature that changes as time passes. The change-in-time set temperature means the set temperature that somehow changes with respect to time. The change-in-time set temperature may include the set temperature that temporarily becomes constant during the film-forming step. That is, the change-in-time set temperature means any set temperature except one that is constant through the whole film-forming step (heat processing step). Hereafter, the same interpretation is accepted.

The embodiment enables to shorten the stabilization time by properly combining the heating rate and the change-in-time set temperature during the film-forming step. The detail is explained later.

(E) From the time t4 to a time t5, the set temperature is lowered from T1 to T0 at a constant rate (cooling step).

(F) After the time t5, the set temperature is maintained at T0. At that time, the wafer boat 220 holding the wafers W is transferred out from the vertical heat-processing furnace 210 (unloading step).

The set temperature profile can be represented by directly specifying the temperature correspondingly to the passage of time as described above, or by specifying a change rate of the temperature such as a heating rate, or by specifying the heater output, or by any other various manners. The representing manner is not limited, and only has to make the passage of time and the temperature of the wafer W correspond to each other.

The set temperature profile is a part of a process recipe that determines the whole heat processing step to the wafers W. In the process recipe, additionally to the set temperature profile, steps of discharging the atmosphere from the inside of the vertical thermal processing furnace 210 and introducing the process gas thereinto are represented correspondingly to the passage of time.

The most important step among the whole heating process is the film-forming step. A part describing the film-forming step in the process recipe is called a film-forming-step describing part.

Figure 24:
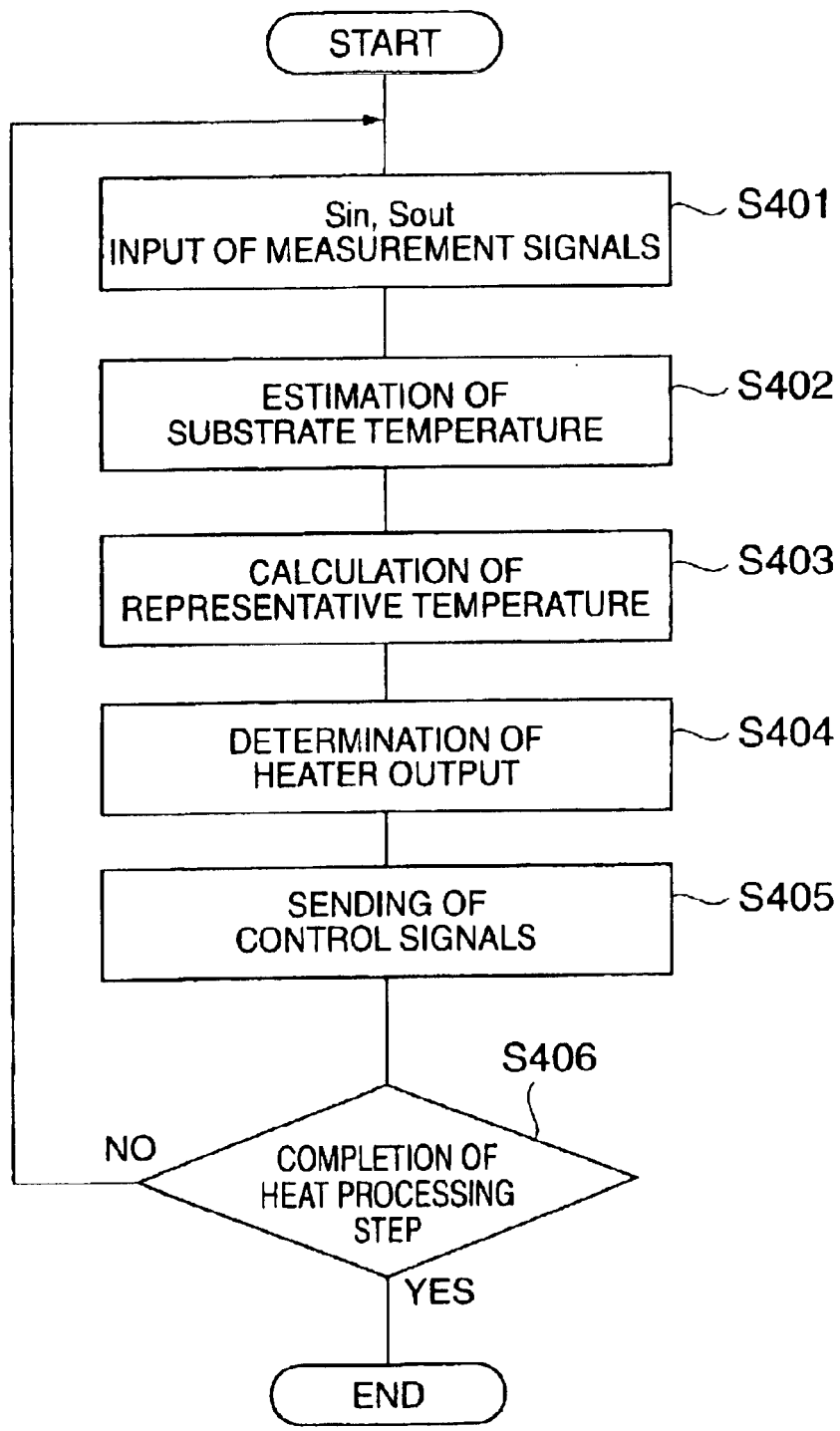
FIG. 24 is a flow chart showing a control procedure for the vertical thermal processing system in the embodiment shown in FIGS. 20 and 21.

FIG. 24 is a flow chart showing a control procedure to be carried out by the controller 300 to control the heater 250. With reference to the flow chart, a temperature-control procedure of the vertical heat-processing furnace 210 is explained.

(A) When the heat process is started, the measurement signals of the temperature sensors $S_{in}$ ($S1_{in}$ to $S5_{in}$) and $S_{out}$ ($S1_{out}$ to $S5_{out}$) are read by the substrate temperature estimating unit 310 (S401).

(B) The substrate temperature estimating unit 310 estimates the central temperatures T1c to T5c and the peripheral temperatures T1e to T5e of the monitor wafers $W_1$ to $W_5$ from the measurement signals of the temperature sensors $S_{in}$ and $S_{out}$ (S402).

The following Expressions (201) and (202) known in the field of control engineering are used for the estimation.

$$X(t+1)=A\cdot x(t)+B\cdot (t) \quad (201)$$

$$Y(t)=C\cdot x(t)+u(t) \quad (202)$$

where:
t: time
x(t): n-dimensional state vector
y(t): m-dimensional output vector
u(t): r-dimensional input vector
A, B, C: n×n, n×r and m×n constant matrices Expressions (201) and (202) are called a state equation and an output equation, respectively. The output vector y(t) can be obtained by solving the simultaneous equations of Expressions (201) and (202).

In this embodiment, the input vector u(t) represents the measurement signals provided by the temperature sensors $S1_{in}$ to $S5_{in}$ and the temperature sensors $S1_{out}$ to $S5_{out}$. The output vector y(t) represents the central temperatures T1c to T5c and the peripheral temperatures T1e to T5e.

In Expressions (201) and (202), the measurement signals provided by the temperature sensors $S_{in}$ and $S_{out}$ and the central temperatures Tc and the peripheral temperatures Te are in a multi-input-output relation. The heating segments 251 to 255 do not affect only the corresponding monitor wafers $W_1$ to $W_5$ but have some influence on all the monitor wafers $W_1$ to $W_5$.

The following expressions (203) and (204) taking into consideration noise may be used as state equations.

$$X(t+1)=A\cdot x(t)+B\cdot u(t)+K\cdot e(t) \quad (203)$$

$$Y(t)=C\cdot x(t)+D\cdot u(t)+e(t) \quad (204)$$

where:
t: time
x(t): n-dimensional state vector
y(t): m-dimensional output vector
u(t): r-dimensional input vector
e(t): m-dimensional noise vector
A, B, C, D, K: n×n, n×r and m×n, m×m and n×m constant matrices The constant matrices A, B, C and D dependent on the thermal characteristics of the thermal processing system may be obtained by, for example, a subspace method.

At first, the measurement signals provided by the temperature sensors $S1_{in}$ to $S5_{in}$ and $S1_{out}$ to $S5_{out}$ and data representing the central point temperatures T1c to T5c and the peripheral point temperatures T1e to T5e are obtained. The constant matrices A, B, C and D can be found by processing the data by, for example, a software Matlab manufactured by The Math Works Inc. and commercially available from Cybernet System Co.

The data can be obtained by gradually changing the outputs of the heating segments 251 to 255 and simultaneously measuring the measurement signals of the temperature sensors $S1_{in}$ to $S5_{in}$ and $S1_{out}$ to $S5_{out}$, the central temperatures T1c to T5c and the peripheral temperatures T1e to T5e, which vary with time. The central temperatures T1c to T5c and the peripheral temperatures T1e to T5e can be measured by using thermocouples connected to the monitor wafers.

Usually, plural combinations of the thus obtained constant matrices A, B, C and D are possible. A combination of the constant matrices A, B, C and D that makes calculated central temperatures T1c to T5c and peripheral temperatures T1e to T5e (which may be calculated by using the simultaneous equations of Expressions (203) and (204)) coincide satisfactorily with measured temperatures is selected (evaluation of the model).

After the combination of the constant matrices A, B, C and D has been selected, the central temperatures T1c to T5c and the peripheral temperatures T1e to T5e can be calculated by processing the measurement signals of the temperature sensors $S1_{in}$ to $S5_{in}$ and $S1_{out}$ to $S5_{out}$ by using the simultaneous equations of Expressions (201) and (202) or Expressions (203) and (204).

(C) The representative-temperature calculating unit 320 calculates representative temperatures T1r to T5r representing the temperatures of the monitor wafers $W_1$ to $W_5$ on the basis of the central temperatures T1c to T5c and the peripheral temperatures T1e to T5e (S403).

The representative temperature T4 may be calculated by using the following Expression (205)

$$Tr=Tc\cdot x+Te\cdot(1-x) \qquad (205)$$

where x is a weight meeting 0<x<1.

As the weight x, taking into consideration the temperature distribution on the wafer W, a value such that the representative temperature Tr properly represents the temperature of the wafer W is adopted. Concretely, the weight x may be for example ⅓.

(D) The heater output determining unit 330 determines output values h1 to h5 to the power controllers 251 to 255 on the basis of the representative temperatures T1r to T5r and the set temperature profiles (S404).

The heater outputs h1 to h5 may be determined correspondingly to differences between the set temperatures Tsp and the representative temperatures Tr (Tsp−Tr). Alternatively, they may be determined correspondingly to changing rates of the temperature such as heating rates.

(E) The heater output determining part 340 outputs the finally-determined heater outputs h1 to h5 to the power controllers 291 to 295 as the control signals (S405), and hence the respective outputs of the heating segments 251 to 255 are controlled.

(F) If the heat process has not been completed, the procedure returns to step S401 to repeat the temperature control operation for controlling the temperature of the semiconductor wafer W (S406).

A loop of steps S402 to S406 is repeated at a period in the range of 1 to 4 seconds.

Next, detail of a temperature control using a set temperature profile according to the invention is explained.

Figure 25:
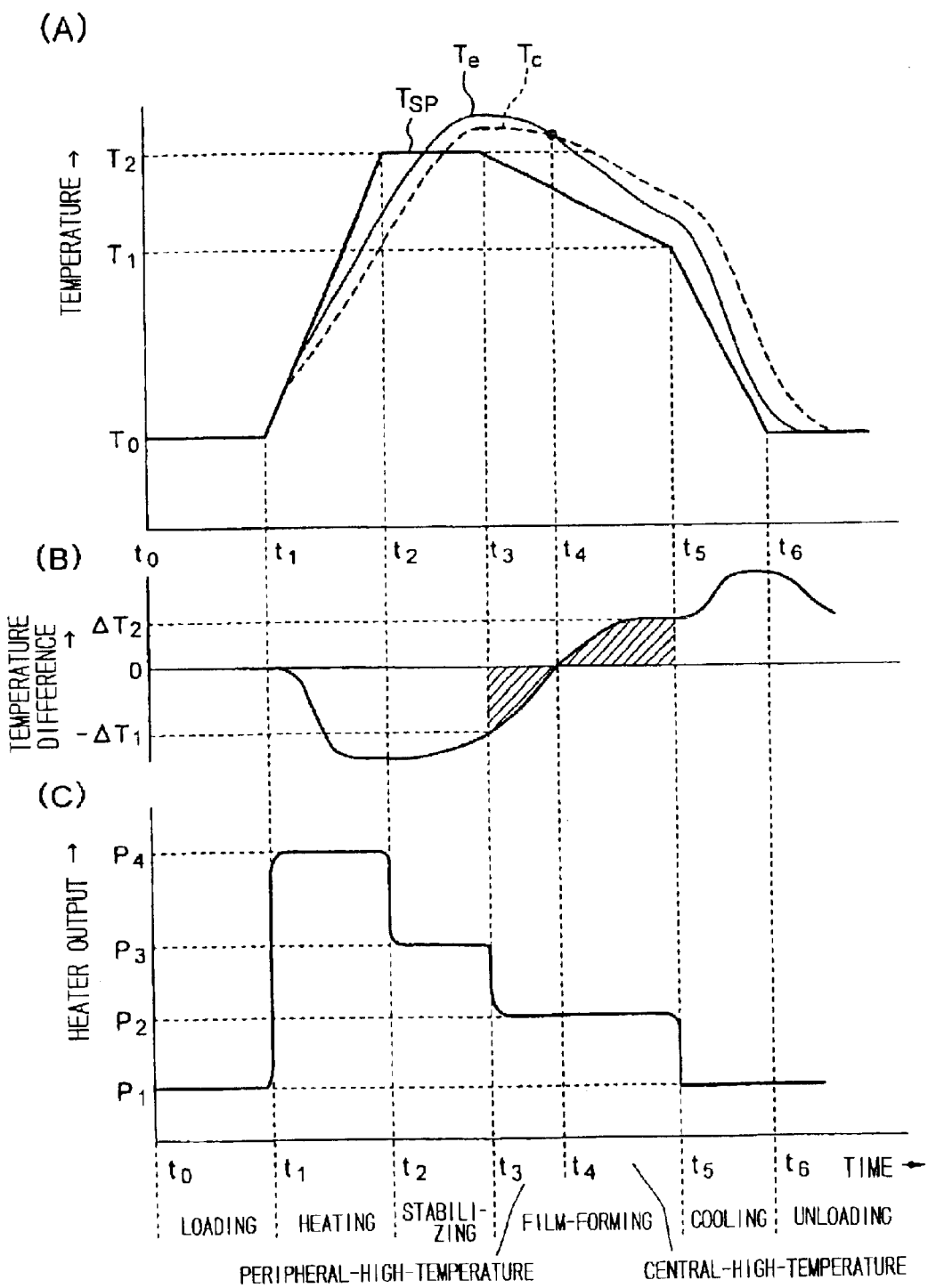
FIG. 25 are graphs showing changes in time of a wafer temperature, a temperature difference within a wafer surface and a heater output, in a case wherein the vertical thermal processing system is controlled in accordance with the set temperature profile in the embodiment shown in FIGS. 20 and 21.

FIG. 25 is graphs showing changes in time of temperatures on a wafer W in a case using the set temperature profile shown in FIG. 23. FIG. 25(A) shows changes in time of a peripheral temperature Te near the periphery of the wafer W and a central temperature Tc near the center of the wafer W, which correspond to the set temperature Tsp. FIG. 25(B) shows a change in time of a temperature difference ΔT (=Tc−Te) within the surface of the wafer W. FIG. 25(C) shows a change in time of an output from the heater 250.

(1) A heating process is conducted form the time t1 to the time t2. During the heating process, the output of the heater 250 is increased from P1 to P4 for a purpose of a rapid heating.

The heater 250 heats the wafers W from the peripheries thereof. Thus, the peripheral temperature Te is raised earlier than the central temperature Tc. Therefore, the temperature difference ΔT is a negative value. That is, the state is a peripheral-high-temperature state wherein the peripheral temperature of the wafer W is higher than the central temperature.

(2) The set temperature is constant at T2 from the time t2 to the time t3. This term stabilizes the temperature of the wafer W. For this term, the output of the heater 250 is lowered from P4 to P3.

However, because of thermal inertia, temperature rising of the wafer W does not stop immediately. Thus, the temperature difference ΔT gradually approaches zero.

(3) The set temperature is gradually lowered from T2 to T1, from the time t3 to the time t5. Correspondingly to that, the output of the heater 250 is lowered from P3 to P2. During the term from the time t3 to the time t5, a process gas such as oxygen gas is introduced to conduct a film-forming process (heat process).

As the set temperature is lowered, the temperature of the wafer W falls down. Herein, the peripheral temperature Te has a greater tendency to rapidly fall down than the central temperature Tc. This is caused by that the heat is radiated from the periphery of the wafer W. That is, both when the wafer is heated and when the heat is radiated from the wafer, the change of the temperature may appear earlier in the periphery of the wafer W than in the center of the wafer W.

The wafer W that has been in the peripheral-high-temperature state during the heating process from the time t1 to the time t2 remains in the peripheral-high-temperature state at the time t3 and the temperature difference ΔT is −ΔT1. This is because the time of the stabilizing step (t3−t2) is short.

However, when the set temperature is lowered, the peripheral temperature falls down earlier than the central temperature. Thus, the peripheral-high-temperature state gradually changes into a central-high-temperature state wherein the central temperature Tc is higher than the peripheral temperature Te. Then, at the time t4, the central temperature and the peripheral temperature become the same. That is, the temperature difference ΔT becomes zero. After that, the state becomes a central-high-temperature state, and the temperature difference ΔT becomes ΔT2 in a stable state.

As described above, the feature of the embodiment is that there are both the central-high-temperature state and the peripheral-high-temperature state during the film-forming step. This means that film-forming conditions at the center and the periphery of the wafer W are close to each other in a view of average in time. Herein, when the temperature changes during the film-forming step, an average of a film-forming rate R (a growing rate of the film) may be represented by using an average in time of the temperature T(Av) as a standard. This is explained as follows.

The film-thickness D of the film formed on the wafer is represented by the following expression (206) by using the film forming rate (the growing rate of the film) R and time t.

$$D=\int_{t3}^{t5}R(T)dt \qquad (206)$$

Herein, ∫ is an integrating symbol. R(T) means that the film-forming rate R is a function of the temperature T.

The film-forming rate R(T) can be developed by a constant term of the temperature T0 into the following expression (207).

$$R(T)=R(T0)+R1(T0)\times(T-T0) \qquad (207)$$

where:

R1(T0): dR(T0)/dt (time differentiation of the film-forming rate)

The following expression (208) can be obtained by substituting (assigning) the expression (207) for the expression (206).

$$D=R(T0)\times(t5-t3)+R1(T0)\times\int_{t3}^{t5}(T-T0)dt \qquad (208)$$

Herein, the average in time of the temperature T (average temperature) T(Av) is defined by the following expression (209).

$$T(Av)=\int_{t3}^{t5}T(t)dt/(t5-t3) \qquad (209)$$

Suppose T0=T(Av) in the expression (208), the following expression (210) can be obtained.

$$D/(t5-t3)=R(T(Av)) \qquad (210)$$

where:

D/(t5−t3): an average of the film-forming rate during the film-forming step (average film-forming rate)

That is, the expression (210) means that the average film-forming rate when the temperature changes during the film-forming step is determined by the average temperature T(Av).

As seen from the above explanation, it is preferable that an average in time of a central temperature (average central temperature) Tc(Av) and an average in time of a peripheral temperature (average peripheral temperature) Te(Av) are close to each other during the film-forming step. The average central temperature Tc (Av) and the average peripheral temperature Te (Av) are represented by the following expressions.

$$Tc(Av)=\int_{t3}^{t5}Tc(t)dt/(t5-t3) \qquad (211)$$

$$Te(Av)=\int_{t3}^{t5}Te(t)dt/(t5-t3) \qquad (212)$$

Herein, suppose $$Tc(Av)=Te(Av) \qquad (213),$$

the following expression (214) can be obtained.

$$\int_{t3}^{t5}(Tc(t)-Te(t))dt=0 \qquad (214)$$

Herein, Tc(t)−Te(t) is the temperature difference ΔT, so that $$\int_{t3}^{t5}(\Delta T(t))dt=0 \qquad (215)$$

As seen from the above explanation, it is preferable that the average central temperature Tc (Av) and the average peripheral temperature Te(Av) are the same, that is, the integrated value of the temperature difference ΔT(t) is zero, with respect to during the film-forming step, in order to uniformly conduct the film-forming process to both the center and the periphery of the wafer W.

This means that a shaded area from the time t3 to the time t4 is equal to a shaded area from the time t4 to the time t5 in FIG. 25(B).

As described above, since the time of the stabilizing step is shortened, even if a temperature difference exits between the central temperature and the peripheral temperature for an initial term of the film-forming step, the film-thickness distribution from the center to the periphery of the wafer W can be made uniform by positively making a temperature difference reverse to the above temperature difference with respect to positive and negative.

If conditions other than the temperature are taken into consideration, for the purpose of making the film-thickness distribution uniform, it is not necessarily the best condition that the average central temperature and the average peripheral temperature of the wafer W are equal. For example, in a reduced-pressure CVD process, there is a tendency wherein a relatively fresh process gas is supplied to the periphery of the wafer and a some-consumed process gas is supplied near the center. That is, in the case, even if the temperature condition is the same, there is a tendency wherein the film-thickness at the center of the wafer W is thin and the film-thickness at the periphery of the wafer W is thick. In the case, it is more preferable that the central temperature is some higher than the peripheral temperature, in order to improve the film-thickness distribution taking into consideration unevenness of the conditions about the process gas.

As described above, it is preferable to adjust the relationship between the average central temperature and the average peripheral temperature, dependently on heat processing conditions to the wafer W.

There are the following methods to adjust the magnitude of the average peripheral temperature and the average central temperature.

① The heating rate of the heating step (from the time t1 to the time t2) is changed.

If the heating rate is increased, the temperature difference between the peripheral temperature Te and the central temperature Tc during the heating step is also increased. Thus, during the film-forming step after that, the average peripheral temperature tends to be higher than the average central temperature.

On the contrary, if the heating rate is lowered, the temperature difference between the peripheral temperature Te and the central temperature Tc during the heating step becomes close to zero. That is, the temperature difference between the peripheral temperature Te and the central temperature Tc becomes small in the periphery-high-temperature state at an initial term of the film-forming step. Thus, with respect to the whole film-forming step, the central-high-temperature state becomes superior to the periphery-high-temperature state. That is, during the film-forming step after that, the average peripheral temperature tends to be lower than the average central temperature.

② The time (t3−t2) of the stabilizing step (from the time t2 to the time t3) is changed.

If the stabilizing time is shortened, the temperature difference between the peripheral temperature Te and the central temperature Tc at an initial term of the film-forming step is increased. Thus, the average peripheral temperature Te tends to be higher than the average central temperature Tc.

On the contrary, if the shortened time is lengthened, the average peripheral temperature Te tends to be lower than the average central temperature Tc.

③ The gradient in time ((T2−T3)/(t5−t3)) of the change-in-time set temperature during the film-forming step (from the time t4 to the time t5) is changed.

If the gradient in time of the set temperature is increased, the peripheral temperature falls down more rapidly than the central temperature. Then, the final temperature difference ΔT2 is also increased. Thus, the average central temperature tends to be higher than the average peripheral temperature.

On the contrary, if the gradient in time of the set temperature is lowered, the final temperature difference ΔT2 becomes small. Thus, the average central temperature tends to be lower than the average peripheral temperature.

As described above, by changing the set temperature profile during the heating step, the stabilizing step or the film-forming step, the average central temperature and the average peripheral temperature during the film-forming step can be controlled.

(4) The set temperature is lowered from T1 to T0, from the time t5 to the time t6. For that term, the introduction of the process gas is stopped. After that, the wafer W is transferred out from the vertical heat-processing furnace 210.

(Comparison)

Next, as a comparison, a case using a set temperature profile, whose set temperature during the film-forming step is a constant set temperature, is explained.

Figure 26:
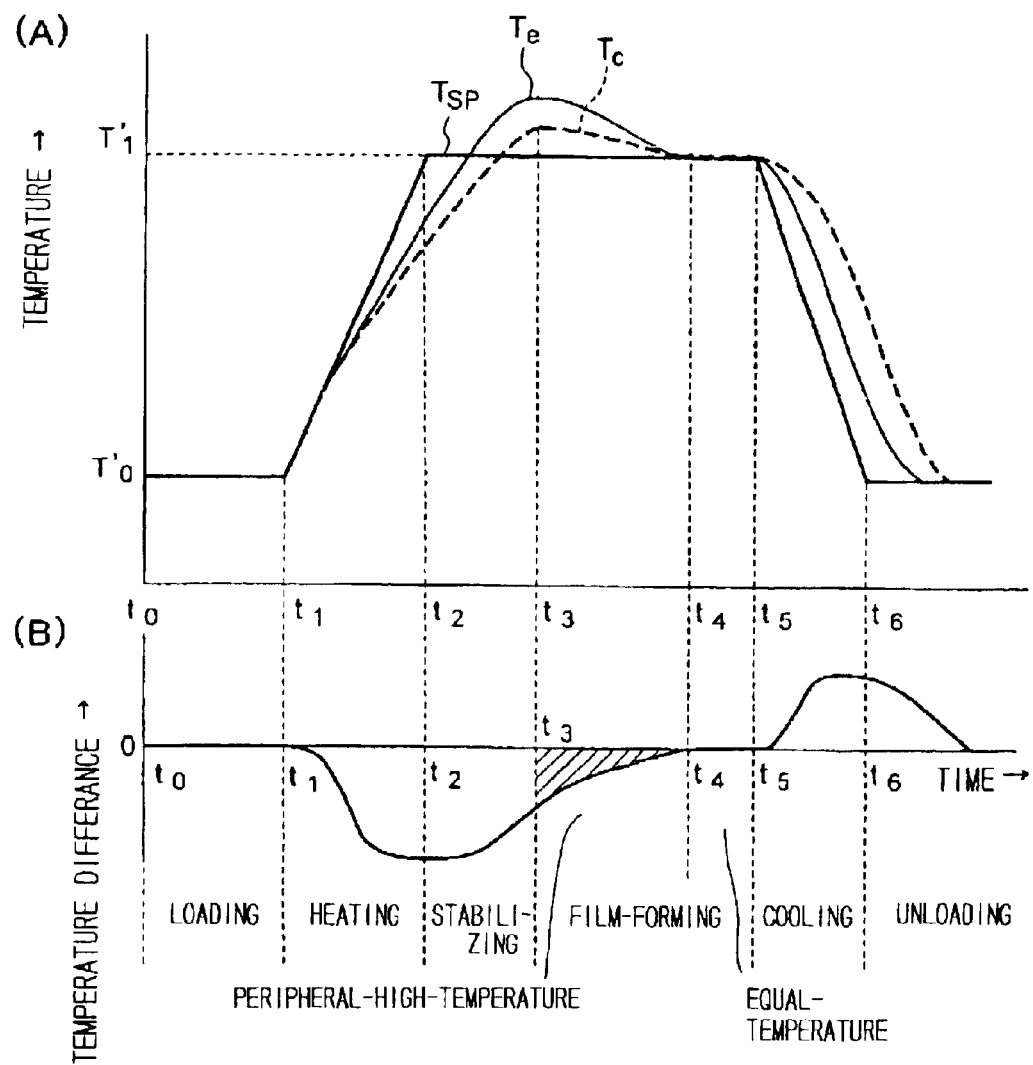
FIG. 26 are graphs showing changes in time of a wafer temperature and a temperature difference within a wafer surface, in a case wherein the vertical thermal processing system is controlled in accordance with a set temperature profile as a comparison.

FIG. 26 are graphs showing the comparison of the invention. FIG. 26(A) is a graph showing changes in time of a set temperature Tsp, a central temperature Tc and a peripheral temperature Te. FIG. 26(B) is a graph showing a change in time of a temperature difference ΔT (=Tc−Te). As shown in FIG. 26(A), the comparison is different from the set temperature shown in FIG. 25 in that the set temperature TSp from the time t3 to the time t5 is constant.

Steps until the stabilizing step is the same as FIG. 25, so that the explanation thereof is omitted.

During the film-forming step from the time t3 to the time t5, the peripheral temperature Te and the central temperature Tc gradually approach a constant set temperature T1'. Herein, before the time t4, the state is a peripheral-high-temperature state wherein the peripheral temperature Te is higher than the central temperature Tc. After the time t4, the state is a equal-temperature state wherein the peripheral temperature Te and the central temperature Tc are substantially equal.

Therefore, during the film-forming step, the average peripheral temperature Te(Av) becomes higher than the average central temperature Tc(Av). That is, the temperature conditions are different between the center and the periphery of the wafer W. Thus, it becomes difficult to secure the uniformity of the film-thickness within the surface of the wafer.

In order to avoid the above problem, it is effective to lengthen the stabilizing time (t3–t2). However, if the stabilizing time is lengthened, the heat processing step needs a longer time.

(Concrete Experiment)

As an example of a concrete heat process, a film-forming process of an oxide film was carried out by using oxygen gas as a process gas. The result is shown in Table 1.

TABLE 1

| Process Recipe | Stabilizing Step | Film-forming Step | Unevenness of Film-thickness within Surface |
|---|---|---|---|
| Recipe 1 (constant set temperature) | 900° C. 5 min | 900° C. | 0.57% |
| Recipe 2 (constant set temperature | 900° C. 1 min | 900° C. | 1.25% |
| Recipe 3 (change-in-time set temperature | 900° C. 1 min | 900° C.–889 ° C. | 0.50% |

Three types of recipes of the heat process, that is, a recipe 1 (comparison) and a recipe 2 (comparison) which have a constant set temperature and a recipe 3 (example) which has a change-in-time set temperature, were used to form an oxide film onto a silicon wafer W. In all the three cases, the wafer was heated to 900° C. and the film-forming step was carried out after respective predetermined stabilizing steps.

As shown in Table 1, the stabilizing time was 5 minutes in the recipe 1. Thus, unevenness of the film-thickness distribution within the surface of the wafer was 0.57%. The stabilizing time was 1 minute in the recipe 2. Thus, unevenness of the film-thickness distribution within the surface of the wafer was deteriorated to 1.25%.

On the contrary, in the recipe 3, the stabilizing time was 1 minute, but the set temperature was gradually lowered from 900° C. to 889° C. while the film-forming step was carried out. Thus, unevenness of the film-thickness distribution within the surface of the wafer was 0.5%, that is, relatively uniform.

(Modified Example)

Next, a modified example of a set temperature profile is explained. The modified example can be carried out by using the heat processing system as described above with reference to FIGS. 20 to 22.

Figure 27:
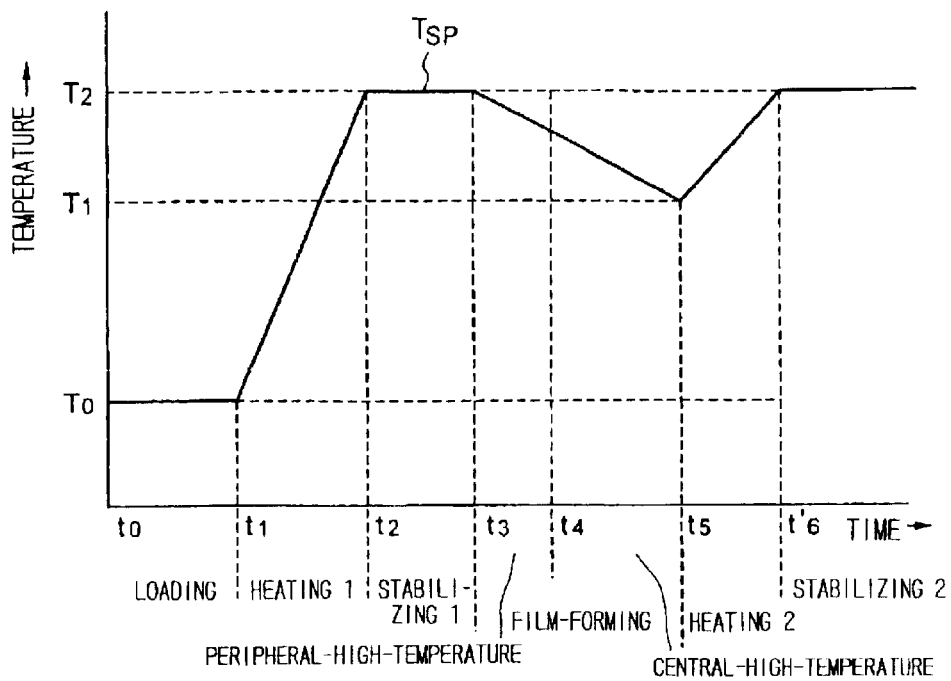
FIG. 27 is a graph showing a variation of a set temperature profile.

FIG. 27 shows an example wherein steps after the film-forming step are changed. The example shown in FIG. 27 is the same as the example shown in FIG. 25 from the t0 to the time t5. However, in the example shown in FIG. 27, a heating step is conducted after the time t5 so that the set temperature Tsp is raised again to T2. After that (after a time t6'), the set temperature Tsp is maintained at T2. If a subsequent process is planned after that, the cooling step as shown in FIG. 25 is not conducted.

Thus, various steps may be added after the film-forming step from the time t3 to the time t5. This may not affect essence of the invention.

Figure 28:
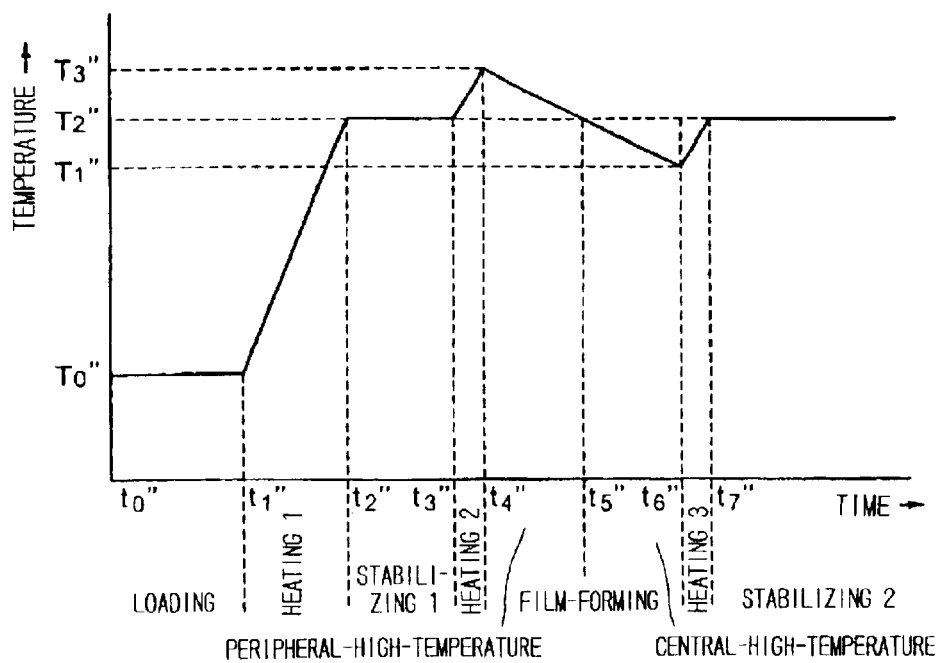
FIG. 28 is a graph showing a variation of a set temperature profile.

Next, FIG. 28 shows an example wherein steps before the film-forming step are changed.

The set temperature shown in FIG. 28 has a first heating step from a time t1" to a time T2", a first stabilizing step from the time t2" to a time t3" and a second heating step from the time t3" to a time t4", before the film-forming step from the time t4" to a time t6". This is the different point from the set temperature profile shown in FIG. 27.

Thus, the set temperature profile during the film-forming step passes through the set temperature T2" in the first stabilizing step at a middle time t5" of the film-forming step.

As described above, steps before the film-forming step may be changed. However, if a step before the film-forming step is changed, the average central temperature and/or the average peripheral temperature during the film-forming step may be changed. Thus, the film-thickness distribution within the surface of the wafer W may be deteriorated. In that case, the set temperature profile is optimized (amended) as the need arises. The optimization may be carried out by using estimated values of the central temperature Tc and the peripheral temperature Te. Alternatively, it may be carried out based on the film-thickness distribution within the surface of the wafer after the heat process.

A set temperature of a second stabilizing step after a time t7" is also T2", that is, the same as the first stabilizing step. Thus, the set temperatures before and after the film-forming step may be made to coincide with each other.

Figure 29:
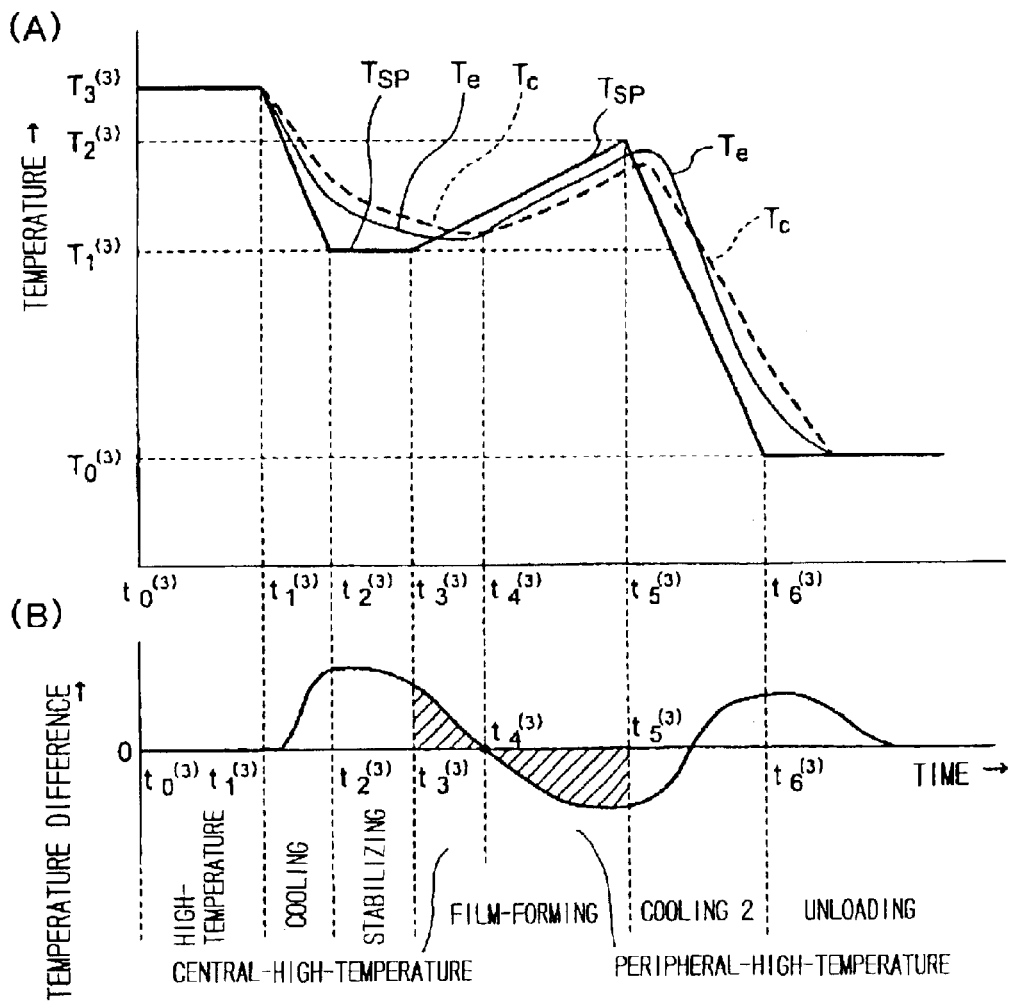
FIG. 29 is a graph showing a variation of a set temperature profile.

In the above explanation, the gradient of the change-in-time set temperature during the film-forming step is negative, but may be positive. Such an example is shown in FIG. 29.

FIG. 29(A) is a graph showing a set temperature Tsp, a central temperature Tc and a peripheral temperature Te of the wafer, correspondingly to the passage of time. FIG. 29(B) is a graph showing a temperature difference ΔT (=Tc−Te) correspondingly to the passage of time.

(1) In the example, from a time $t0^{(3)}$ to a time $t1^{(3)}$, the temperature is constant at $T3^{(3)}$. The temperature $T3^{(3)}$ is higher than a temperature during the film-forming step (high-temperature step).

The central temperature Tc and the peripheral temperature Te of the wafer W during the term are supposed to be $T3^{(3)}$ similarly to the set temperature Tsp.

(2) After that, from the time $t1^{(3)}$ to a time $t2^{(3)}$, the set temperature is lowered from $T3^{(3)}$ to $T1^{(3)}$ (cooling step).

For that term, as already described above, the heat is radiated from the periphery of the wafer W. Thus, the peripheral temperature Te falls down earlier than the central temperature Tc. Thus, the state becomes a central-high-temperature state wherein the central temperature is higher than the peripheral temperature, so that the temperature difference $\Delta T$ (=Tc−Te) becomes positive.

(3) The set temperature Tsp is maintained at the constant value from the time $t2^{(3)}$ to a time $t3^{(3)}$ (stabilizing step).

For that term, the temperature difference $\Delta T$ gradually approaches zero. However, before the temperature difference $\Delta T$ becomes zero, the subsequent film-forming step is started. The stabilizing step may be omitted depending on the situation.

(4) From the time $t3^{(3)}$ to a time $t5^{(3)}$, the set temperature Tsp is gradually raised from $T1^{(3)}$ to $T2^{(3)}$, and the process gas such as oxygen gas is introduced into the vertical heat-processing furnace 210 to conduct the film-forming process (film-forming step).

For that term, the wafer W is heated from the periphery thereof. Thus, the peripheral temperature Te rises earlier than the central temperature Tc. Thus, at a time $t4^{(3)}$, the state of the wafer W changes from the central-high-temperature state into a peripheral-high-temperature state. After that, the temperature difference $\Delta T$ becomes negative.

As described above, in the example shown in FIG. 29 too, there are both the central-high-temperature state and the peripheral-high-temperature state during the film-forming step. Thus, the central-high-temperature state and the peripheral-high-temperature state may cancel out each other, so that an integrated value of the temperature difference $\Delta T$ may approach zero. This means that the average central temperature Tc(Av) and the average peripheral temperature Te(Av) during the film-forming step may approach each other, as shown in the expression (214).

Therefore, the film-thickness distribution within the surface of the wafer W is expected to approach a uniform one.

(5) The cooling step from the time $t5^{(3)}$ to a time $t6^{(3)}$ and the unloading step after the time $t6^{(3)}$ are essentially the same as the case of FIG. 25, so that description thereof is omitted.

As described above, the invention is also applicable to a case wherein a change-in-time set temperature during the film-forming step has a positive gradient. This may be suitable for a case wherein some high-temperature step is conducted as a preprocess and then a heat process is conducted.

(Other Embodiments)

The above embodiments may be expanded or modified within a scope of technical conception of the invention.

For example, the substrate is not limited to the semiconductor wafer, but may be for example a glass substrate.

The heat processing system is not limited to the vertical heat-processing furnace or a batch furnace, but may be a single-type of heat processing system that conducts a heat process to each wafer one by one. However, depending on an arrangement relationship between the substrate and a heater, the gradient of a change-in-time set temperature and an appearance order of the peripheral-high-temperature state and the central-high-temperature state may be different.

The relationship is shown in Table 2.

TABLE 2

| Heating Type | Gradient of Change-in-time Set Temperature (During Film-forming) | Appearance Order of High-Temperature State |
|---|---|---|
| Periphery-heating (Batch-type Heat-processing Furnace) | positive | Central-high temperature state → Peripheral-high-temperature state |
|  | negative | Peripheral-high-temperature state → Central-high temperature state |
| Center-heating (Single-type Heat-processing Furnace) | positive | Peripheral-high-temperature state → Central-high temperature state |
|  | negative | Central-high temperature state → Peripheral-high-temperature state |

As already described above, in the vertical heat-processing furnace (an example of a batch type of heat processing furnace), if the gradient of the change-in-time set temperature is negative (FIG. 25), the order is from the peripheral-high-temperature state to the central-high-temperature state. If the gradient of the change-in-time set temperature is positive (FIG. 29), the order is from the central-high-temperature state to the peripheral-high-temperature state.

This is caused by that the peripheral temperature changes earlier than the central temperature because the vertical heat-processing furnace conducts a heat process to layered wafers W, that is, because the layered wafers W are heated from peripheries thereof and heat is radiated therefrom (periphery-heating type).

On the contrary, in the single type of heat processing furnace, the wafers W undergo a heat process one by one. Thus, usually, the wafer W is heated from the surface thereof, that is, from a position near the center thereof, and heat is radiated therefrom (center-heating type). Thus, the central temperature tends to change earlier than the peripheral temperature, so that the appearance order of the high-temperature states (the central-high-temperature state, the peripheral-high-temperature state) becomes reverse to that by the periphery-heating type.

Thus, the invention is applicable to both the batch type and the single type.

It is preferable to change the gradient of a change-in-time set temperature depending on whether a previous step before a stabilizing step is a heating step or a cooling step. This is shown in Table 3.

TABLE 3

| Pre-process (Before Stabilizing Step) | Gradient of Change-in-time Set Temperature (During Film-forming) |
|---|---|
| Heating (Gradient of Set Temperature: positive) | negative |
| Cooling (Gradient of Set Temperature: negative) | positive |

That is, if the previous step is a heating step, it is preferable to make the gradient of the change-in-time set temperature negative (FIG. 25). If the previous step is a cooling step, it is preferable to make the gradient of the change-in-time set temperature positive (FIG. 29).

This relationship may be applicable whether the heating type is a periphery-heating type or a center-heating type.

In addition, it goes without saying that a previous step may be neglected if the previous step is so short that it may not affect the temperature distribution of the substrate.

The gradient of the change-in-time set temperature is not necessarily constant. The invention has a feature that the two states of the central-high-temperature state and the peripheral-high-temperature state appear during the film-forming step. Thus, the gradient of the change-in-time set temperature may change. Depending on the situation, positive and negative of the gradient may change during the film-forming step.

In addition, the two states of the central-high-temperature state and the peripheral-high-temperature state may appear not only once, respectively. For example, during the film-forming step, the states may appear in the order of a central-high-temperature state, a peripheral-high-temperature state and a central-high-temperature state.

The object of the heat process may be any one of diffusion, annealing, film-forming by a thermal oxidation and film-forming by a CVD (Chemical Vapor Deposition) (for example, film-forming of a SiN film or the like). That is, the invention is applicable to various processing steps that may suffer from temperature distribution within the substrate.

The number of divided segments of the heater is not limited to five. The heater may not be divided. In addition, in order to control the heater, the representative temperature Tr does not have to be calculated always from the central temperature Tc and the peripheral temperature Te. Any other temperature somehow representing the substrate may be appropriately used.

The central temperatures Tc and the peripheral temperatures Te may be directly measured instead of being estimated from the measurement signals of the temperature sensors $S_{in}$ and $S_{out}$. For example, (a) a method of arranging temperature sensors such as thermocouples on the monitor wafers W1 to W5 or (b) a non-contact measuring method using radiation pyrometers or the like may be utilized. In the case, the measurement signals of the temperature sensors $S_{in}$ and $S_{out}$ are not used.

As described above, according to the invention, film-thickness distribution can be made uniform with respect to between a plurality of substrates (between a plurality of groups of the substrates) or within a surface of each of the substrates.

Alternatively, according to the invention, during a heat process, there are both a central-high-temperature state wherein a temperature near the central portion of a substrate is higher and a peripheral-high-temperature state wherein a temperature near the peripheral portion thereof is higher. The central-high-temperature state and the peripheral-high-temperature state may cancel out each other, that is, the central temperature and the peripheral temperature may approach each other in their averages with respect to time. Thus, even if a stabilization time is shortened, it becomes easy to secure uniformity of the heat process to a surface of the substrate.

What is claimed is:

1. A method of determining a set temperature profile for a method of controlling respective substrate temperatures of a plurality of groups in accordance with respective corresponding set temperature profiles, in a method of heat processing a plurality of substrates that are classified into the plurality of groups, the method of determining a set temperature profile comprising;

a first heat processing step of controlling respective substrate temperatures of a plurality of groups in accordance with respective predetermined provisional set temperature profiles for first-batch substrates that are classified into the plurality of groups, and of introducing a process gas to conduct a heat process to form films on the substrates;

a first film-thickness measuring step of measuring a thickness of the films formed on the substrates; and a first set-temperature-profile amending step of respectively amending the provisional set temperature profiles based on the measured thickness, in such a manner that a thickness of films formed during a heat process is substantially the same between the plurality of groups;

wherein, in the first heat processing step, the provisional set temperature profiles are profiles whose set temperatures change as time passes.

2. A method of determining a set temperature profile according to claim 1, wherein:

in the first heat processing step, set temperatures of the provisional set temperature profiles have a substantially constant gradient with respect to time.

3. A method of determining a set temperature profile according to claim 1, wherein:

in the first film-thickness measuring step, for at least one substrate in each of the plurality of groups, film thickness is measured at a plurality of points of each substrate, and an average of the measured values is obtained as a film thickness of the substrate.

4. A method of determining a set temperature profile according to claim 1, wherein;

in the first set-temperature-profile amending step, averages of ideal set temperatures to be amended are calculated based on a thickness-temperature dependant relationship between the substrate temperatures and the film thickness, and the provisional set temperature profiles are amended based on the averages.

5. A method of determining a set temperature profile according to claim 1, further comprising after the first set-temperature-profile amending step;

a second heat processing step of controlling the respective substrate temperatures of the plurality of groups in accordance with respective amended first set temperature profiles for second-batch substrates that are classified into the plurality of groups, and of introducing a process gas to conduct a heat process to form films on the substrates;

a second film-thickness measuring step of measuring a thickness of the films formed on the substrates; and a second set-temperature-profile amending step of respectively amending the first set temperature profiles based on the measured thickness, in such a manner that a thickness of films formed during a heat process is substantially the same between the plurality of groups.

6. A method of determining a set temperature profile according to claim 5, wherein:

in the second set-temperature-profile amending step, averages of ideal set temperatures to be amended are calculated based on a thickness-temperature dependant relationship between the substrate temperatures and the film thickness, and the first set temperature profiles are amended based on the averages.

7. A method of determining a set temperature profile according to claim 6, wherein:

in the second set-temperature-profile amending step, the thickness-temperature dependant relationship between the substrate temperatures and the film thickness is amended based on averages in time of the provisional set temperature profiles during the first heat processing step, film thickness of the films on the first-batch substrates, averages in time of the first set temperature profiles during the second heat processing step, and film thickness of the films on the second-batch substrates.

8. A method of determining a set temperature profile according to claim 5, wherein:

the second heat processing step, the second film-thickness measuring step and the second set-temperature-profile amending step are repeated at least twice in order thereof.

9. A method of determining a set temperature profile according to claim 5, wherein:

the second heat processing step, the second film-thickness measuring step and the second set-temperature-profile amending step are repeated at least twice in order thereof.

10. A method of determining a set temperature profile for a method of controlling respective substrate temperatures of a plurality of groups in accordance with respective corresponding set temperature profiles, in a method of heat processing a plurality of substrates that are classified into the plurality of groups, the method of determining a set temperature profile comprising;

a first set-temperature-profile determining step of determining first set temperature profiles, each of which is set for each of a plurality of groups of substrates, in accordance with which films of substantially the same thickness between the plurality of groups are formed on the substrates when a process gas is introduced to conduct a heat process, and whose set temperatures don't change as time passes during the heat process, a second set-temperature-profile determining step of determining second set temperature profiles, each of which is set for each of the plurality of groups of the substrates by amending each first set temperature profile, in accordance with which a film of substantially the same thickness is formed on each of the substrates when a process gas is introduced to conduct a heat process, and whose set temperatures change as time passes during the heat process, and a third set-temperature-profile determining step of determining third set temperature profiles, each of which is set for each of the plurality of groups of the substrates by amending each second set temperature profile, in accordance with which films of substantially the same thickness between the plurality of groups are formed on the substrates when a process gas is introduced to conduct a heat process, and whose set temperatures change as time passes during the heat process.

11. A method of determining a set temperature profile according to claim 10, wherein:

the first set-temperature-profile determining step includes:

a first heat processing step of controlling respective substrate temperatures of the plurality of groups in accordance with respective predetermined provisional set temperature profiles for first-batch substrates that are classified into the plurality of groups, and of introducing a process gas to conduct a heat process to form films on the substrates;

a first film-thickness measuring step of measuring a thickness of the films formed on the substrates; and a first set-temperature-profile amending step of calculating ideal constant set temperatures based on the measured thickness, in such a manner that a thickness of films formed during a heat process is substantially the same between the plurality of groups, and of respectively amending the provisional set temperature profiles based on the ideal constant set temperatures.

12. A method of determining a set temperature profile according to claim 11, wherein;

in the first set-temperature-profile amending step, the ideal constant set temperatures are calculated based on a thickness-temperature dependant relationship between the substrate temperatures and the film thickness.

13. A method of determining a set temperature profile according to claim 12, wherein:

in the first film-thickness measuring step, for at least one substrate in each of the plurality of groups, film thickness is measured at a plurality of points of each substrate, and an average of the measured values is obtained as a film thickness of the substrate.

14. A method of determining a set temperature profile according to claim 11, wherein:

the first set-temperature-profile determining step includes after the first set-temperature-profile amending step;

a second heat processing step of controlling the respective substrate temperatures of the plurality of groups in accordance with respective amended provisional set temperature profiles for second-batch substrates that are classified into the plurality of groups, and of introducing a process gas to conduct a heat process to form films on the substrates;

a second film-thickness measuring step of measuring a thickness of the films formed on the substrates; and a second set-temperature-profile amending step of calculating again ideal constant set temperatures based on the measured thickness, in such a manner that a thickness of films formed during a heat process is substantially the same between the plurality of groups, and of respectively amending again the amended provisional set temperature profiles based on the ideal constant set temperatures.

15. A method of determining a set temperature profile according to claim 14, wherein;

in the second set-temperature-profile amending step, the ideal constant Bet temperatures are calculated again based on a thickness-temperature dependant relationship between the substrate temperatures and the film thickness.

16. A method of determining a set temperature profile according to claim 15, wherein:

in the second set-temperature-profile amending step, the thickness-temperature dependant relationship between the substrate temperatures and the film thickness is amended based on set temperatures of the provisional set temperature profiles during the first heat processing step, film thickness of the films on the first-batch substrates, set temperatures of the amended provisional set temperature profiles during the second heat processing step, and film thickness of the films on the second-batch substrates.

17. A method of determining a set temperature profile according to claim 11, wherein:

the third set-temperature-profile determining step includes:

a fifth heat processing step of controlling respective substrate temperatures of the plurality of groups in accordance with the respective second set temperature profiles for fifth-batch substrates that are classified into the plurality of groups, and of introducing a process gas to conduct a heat process to form films on the substrates;

a fifth film-thickness measuring step of measuring a thickness of the films formed on the substrates; and a fifth set-temperature-profile amending step of calculating averages of set temperatures based on the measured thickness, in such a manner that a thickness of films formed during a heat process is substantially the same between the plurality of groups, and of respectively amending the second set temperature profiles based on the averages of set temperatures.

18. A method of determining a set temperature profile according to claim 10, wherein:

averages in time of set temperatures of the second set temperature profiles during the heat process are substantially the same as constant set temperatures of the first set temperature profiles during the heat process.

19. A method of determining a set temperature profile according to claim 10, wherein:

set temperatures of the second set temperature profiles during the heat process have a substantially constant gradient with respect to time.

20. A method of determining a set temperature profile according to claim 10, wherein:

the second set-temperature-profile determining step includes:

a third heat processing step of controlling respective substrate temperatures of the plurality of groups in accordance with the respective first set temperature profiles for third-batch substrates that are classified into the plurality of groups, and of introducing a process gas to conduct a heat process to form films on the substrates;

a third film-thickness measuring step of measuring a thickness distribution of the films formed on the substrates; and a third set-temperature-profile amending step of respectively amending the first set temperature profiles based on the measured thickness distribution.

21. A method of determining a set temperature profile according to claim 20, wherein:

the third film-thickness measuring step includes:

a step of measuring a film thickness on the substrate near a central portion thereof, and a step of measuring a film thickness on the substrate near a plurality of peripheral portions thereof.

22. A method of determining a set temperature profile according to claim 20, wherein:

the third film-thickness measuring step includes:

a step of obtaining the thickness distribution on the substrates as a function of a distance from a substantially center thereof.

23. A method of determining a set temperature profile according to claim 22, wherein:

the function is a function of a square of the distance from the substantially center thereof.

24. A method of determining a set temperature profile according to claim 20, wherein:

the third film-thickness measuring step includes:

a step of obtaining the thickness distribution on the substrates as a difference between a film thickness near a central portion thereof and a film thickness near a peripheral portion thereof.

25. A method of determining a set temperature profile according to claim 20, wherein:

in the third set-temperature-profile amending step, a necessary temperature distribution in one substrate that is necessary for forming a film whose thickness is substantially uniform within a surface of the substrate is adapted to be calculated based on a thickness-temperature dependant relationship between the substrate temperatures and the film thickness and the measured thickness distribution.

26. A method of determining a set temperature profile according to claim 25, wherein:

the necessary temperature distribution is represented by a difference between a temperature of the substrate near a central portion thereof and a temperature of the substrate near a peripheral portion thereof.

27. A method of determining a set temperature profile according to claim 25, wherein:

in the third set-temperature-profile amending step, necessary gradients with respect to time of set temperature profiles to be obtained by amended are calculated based on a dependant relationship between gradients with respect to time of set temperature profiles and temperature distribution within the substrate and the necessary temperature distribution, and the first set temperature profiles are adapted to be amended based on the necessary gradients.

28. A method of determining a set temperature profile according to claim 20, wherein:

the second set-temperature-profile determining step includes after the third set-temperature-profile amending step;

a fourth heat processing step of controlling the respective substrate temperatures of the plurality of groups in accordance with respective amended first set temperature profiles for fourth-batch substrates that are classified into the plurality of groups, and of introducing a process gas to conduct a heat process to form films on the substrates;

a fourth film-thickness measuring step of measuring a thickness distribution of the films formed on the substrates; and a fourth set-temperature-profile amending step of respectively amending again the amended first set temperature profiles based on the measured thickness distribution.

29. A method of determining a set temperature profile according to claim 28, wherein:

in the fourth set-temperature-profile amending step, a necessary temperature distribution in one substrate that is necessary for forming a film whose thickness is substantially uniform within a surface of the substrate is adapted to be calculated based on a thickness-temperature dependant relationship between the substrate temperatures and the film thickness and the measured thickness distribution.

30. A method of determining a set temperature profile according to claim 29, wherein:

in the fourth set-temperature-profile amending step, the thickness-temperature dependant relationship between the substrate temperatures and the film thickness is amended based on averages in time of the first set temperature profiles during the third heat processing step, film thickness of the films on the third-batch substrates, averages in time of the amended first set temperature profiles during the fourth heat processing step, and film thickness of the films on the fourth-batch substrates.

31. A method of determining a set temperature profile according to claim 28, wherein:

the fourth heat processing step, the fourth film-thickness measuring step and the fourth set-temperature-profile amending step are repeated at least twice in order thereof.

* * * * *